US012578441B2

(12) United States Patent
Sakakibara et al.

(10) Patent No.: US 12,578,441 B2
(45) Date of Patent: Mar. 17, 2026

(54) SENSING DEVICE AND DISTANCE MEASURING APPARATUS

(71) Applicant: Sony Semiconductor Solutions Corporation, Kanagawa (JP)

(72) Inventors: Masaki Sakakibara, Kanagawa (JP); Hidekazu Kikuchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 931 days.

(21) Appl. No.: 17/763,892

(22) PCT Filed: Oct. 22, 2020

(86) PCT No.: PCT/JP2020/039647
§ 371 (c)(1),
(2) Date: Mar. 25, 2022

(87) PCT Pub. No.: WO2021/090691
PCT Pub. Date: May 14, 2021

(65) Prior Publication Data
US 2022/0350001 A1     Nov. 3, 2022

(30) Foreign Application Priority Data

Nov. 5, 2019     (JP) ................................. 2019-200770

(51) Int. Cl.
*G01S 7/4865* (2020.01)
*G01S 7/481* (2006.01)
(Continued)

(52) U.S. Cl.
CPC .......... *G01S 7/4865* (2013.01); *G01S 7/4816* (2013.01); *G01S 17/931* (2020.01); *H03K 3/00* (2013.01); *H03K 4/00* (2013.01)

(58) Field of Classification Search
CPC ..... G01S 7/4865; G01S 17/931; G01S 7/4816
See application file for complete search history.

(56) References Cited

U.S. PATENT DOCUMENTS 4,945,227 A * 7/1990 Jones ........................ G01J 1/44
                                                        250/214 R
5,883,378 A * 3/1999 Irish ........................ H01S 5/042
                                                        250/573
(Continued)

FOREIGN PATENT DOCUMENTS

CN          106338339 A          1/2017
CN          107063452 A          8/2017
(Continued)

OTHER PUBLICATIONS

International Search Report (PCT/ISA/210), International Application No. PCT/JP2020/039647, dated Dec. 28, 2020.
(Continued)

*Primary Examiner* — Marlon T Fletcher
*Assistant Examiner* — Kimberly Newman Frey
(74) *Attorney, Agent, or Firm* — Michael Best & Friedrich LLP

(57)          ABSTRACT

Sensing devices configured to detect photons with high accuracy regardless of environmental illuminance are disclosed. In one example, a sensing device includes a photodetector and a load element connected between the photodetector and a first reference potential. A first transistor is configured to be turned on according to a voltage of a node between the photodetector and the load element. A second transistor is configured to turn on according to either a current of the first transistor or a voltage of a second signal line. A third transistor of an opposite conductivity type to the first and second transistors is configured to turn on according to the voltage of the second signal line. A first inverter is connected between a node between the first transistor and the third transistor and a fourth signal line.

20 Claims, 32 Drawing Sheets

(51) Int. Cl.
    *G01S 17/931*     (2020.01)
    *H03K 3/00*     (2006.01)
    *H03K 4/00*     (2006.01)

(56)         References Cited

U.S. PATENT DOCUMENTS

| | | | | |
|---|---|---|---|---|
| 6,046,461 | A * | 4/2000 | Saitoh | H03F 3/082 |
| | | | | 257/83 |
| 9,277,147 | B2 * | 3/2016 | Beck | H04N 25/59 |
| 10,012,534 | B2 * | 7/2018 | Andreou | G01J 1/44 |
| 11,520,050 | B2 * | 12/2022 | Iguchi | G01S 17/894 |
| 2002/0145107 | A1 * | 10/2002 | Deschamps | H10F 77/953 |
| | | | | 250/214 R |
| 2012/0314994 | A1 * | 12/2012 | Colgan | H01L 23/49816 |
| | | | | 257/E21.599 |
| 2014/0124652 | A1 | 5/2014 | Dutton et al. | |
| 2017/0131143 | A1 | 5/2017 | Andreou et al. | |
| 2017/0301716 | A1 * | 10/2017 | Irish | G01S 7/4863 |
| 2018/0124338 | A1 * | 5/2018 | Augusto | H04N 25/585 |
| 2019/0219443 | A1 | 7/2019 | Fujimoto | |
| 2020/0183013 | A1 * | 6/2020 | Iguchi | G01S 7/4863 |

FOREIGN PATENT DOCUMENTS

| | | |
|---|---|---|
| CN | 108288622 A | 7/2018 |
| CN | 107271036 B | 1/2019 |
| JP | 2004-509586 A | 3/2004 |
| JP | 2016161438 A | 9/2016 |
| JP | 2018179732 A | 11/2018 |
| JP | 2019007877 A | 1/2019 |

OTHER PUBLICATIONS

Cristiano Niciass, et.al, "A 0.18 μm CMOS SoC for a 100m-Range 10fps 200×96-Pixel Time-of-Flight Depth Sensor" ISSCC2013.
Matteo Perenzoni, et.al, "A 64×64-Pixels Digital Silicon Photomultiplier Direct TOF Sensor With 100-MPhotons/s/pixel Background Rejection and Imaging/Altimeter Mode With 0.14% Precision Up To 6 km for Spacecraft Navigation and Landing", JSSC2017.
Korean Office Action date Dec. 4, 2025 for corresponding Korean Application No. 10-2022-7014104.

* cited by examiner

F I G . 3
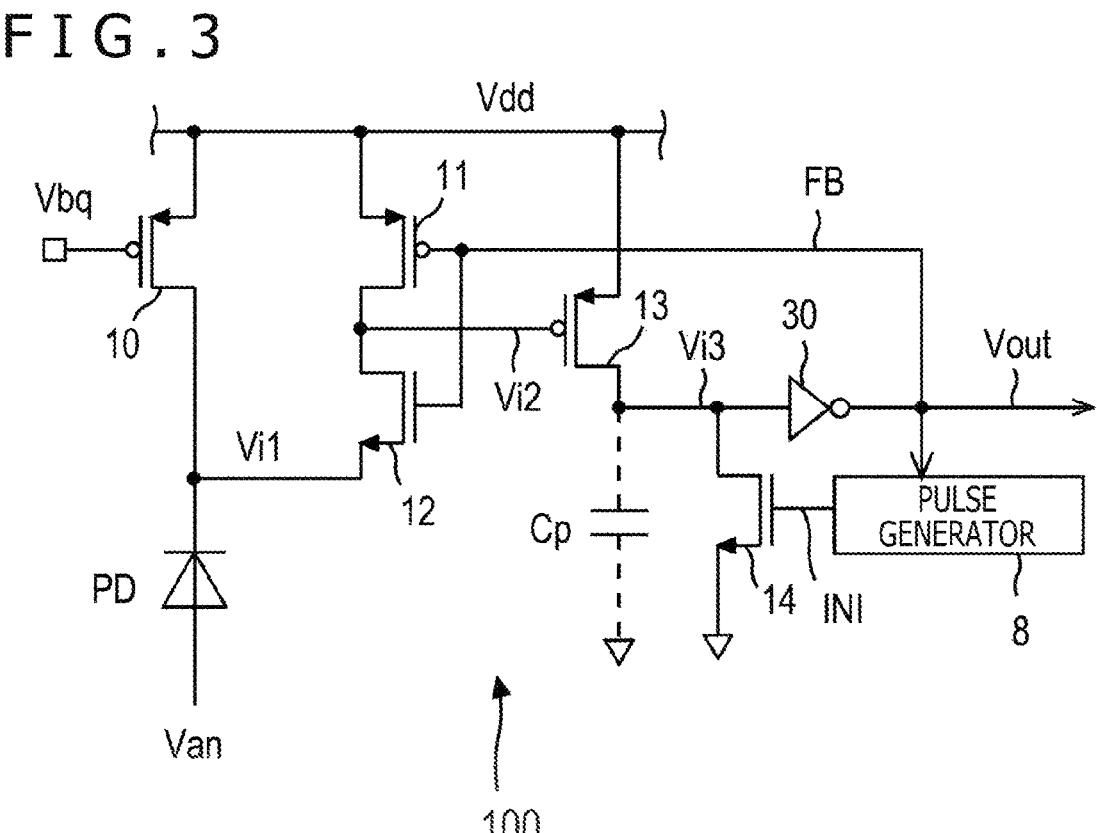

FIG.4
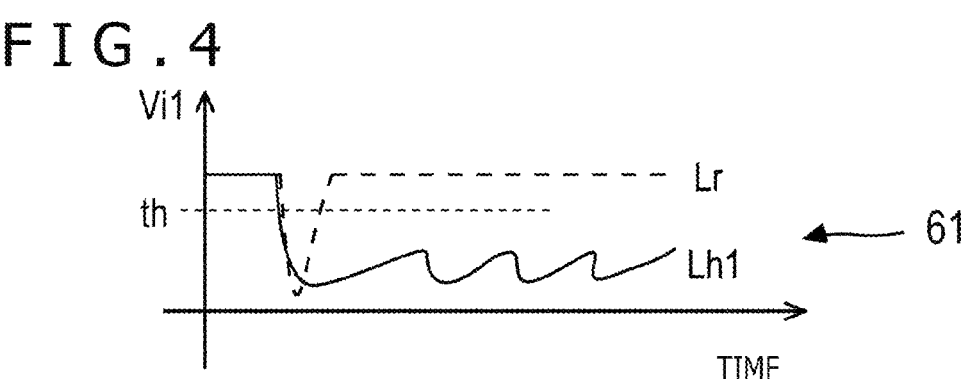
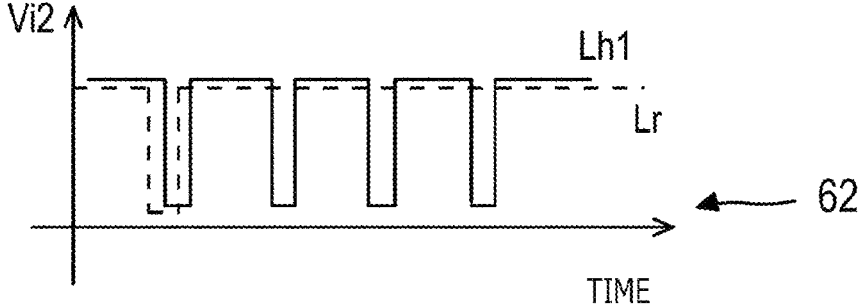
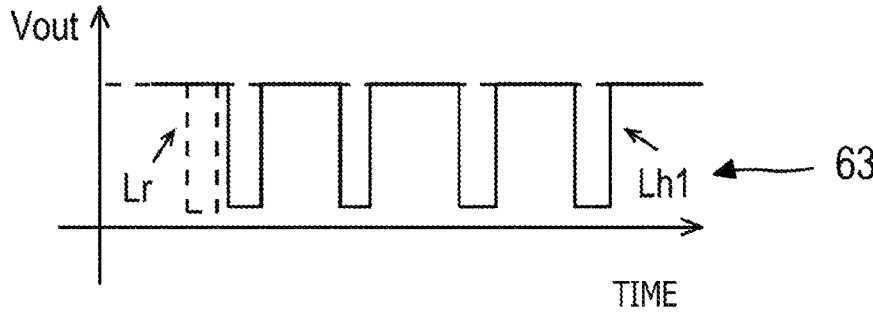
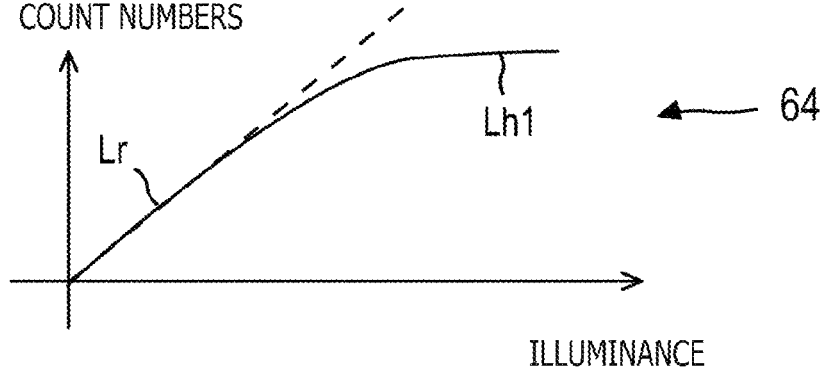

F I G . 8
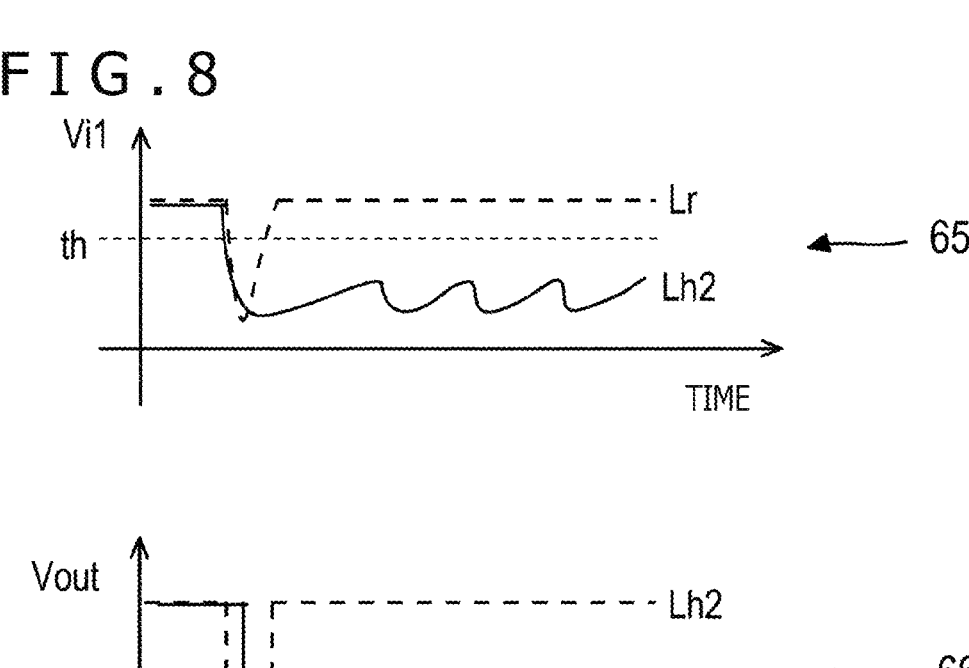
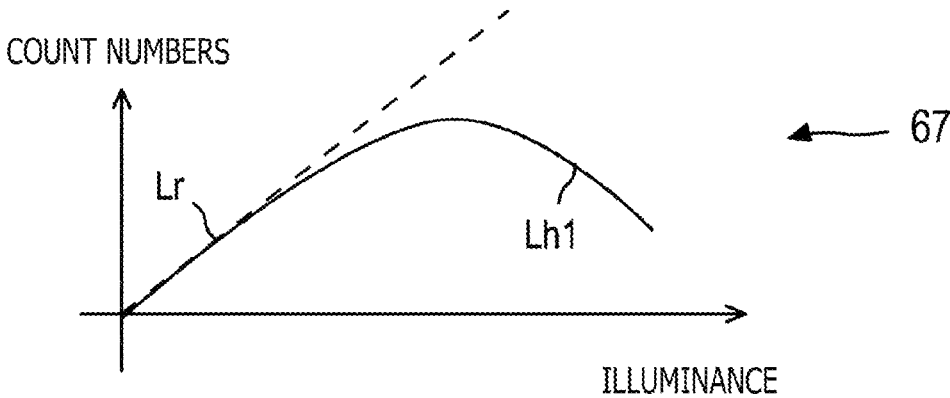

FIG. 9
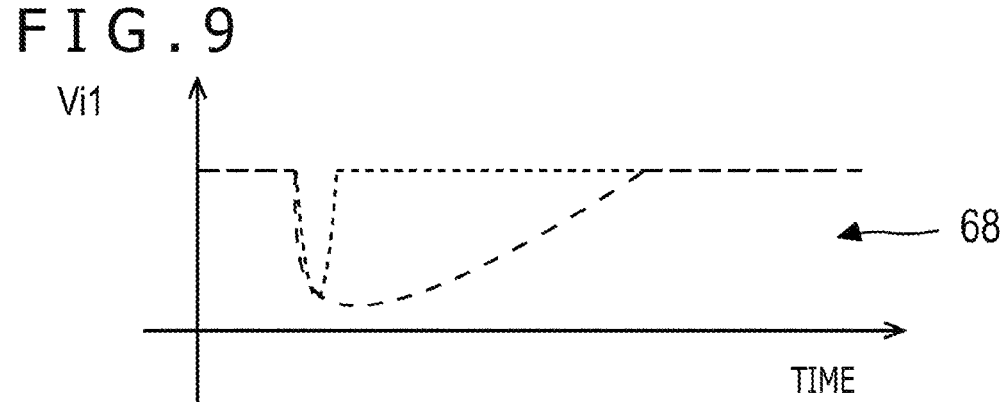
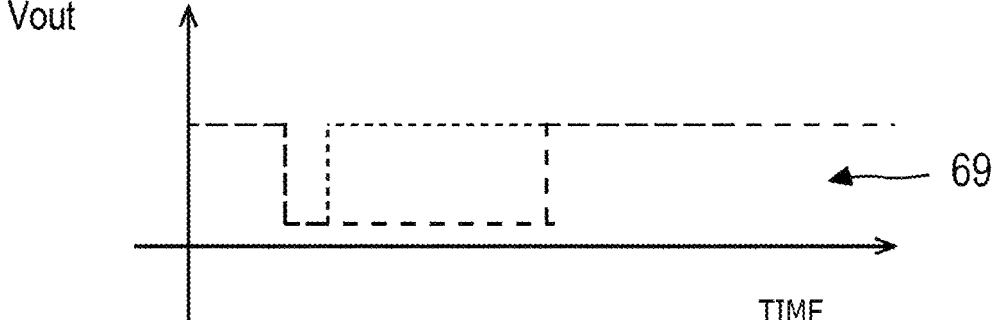

F I G . 1 0
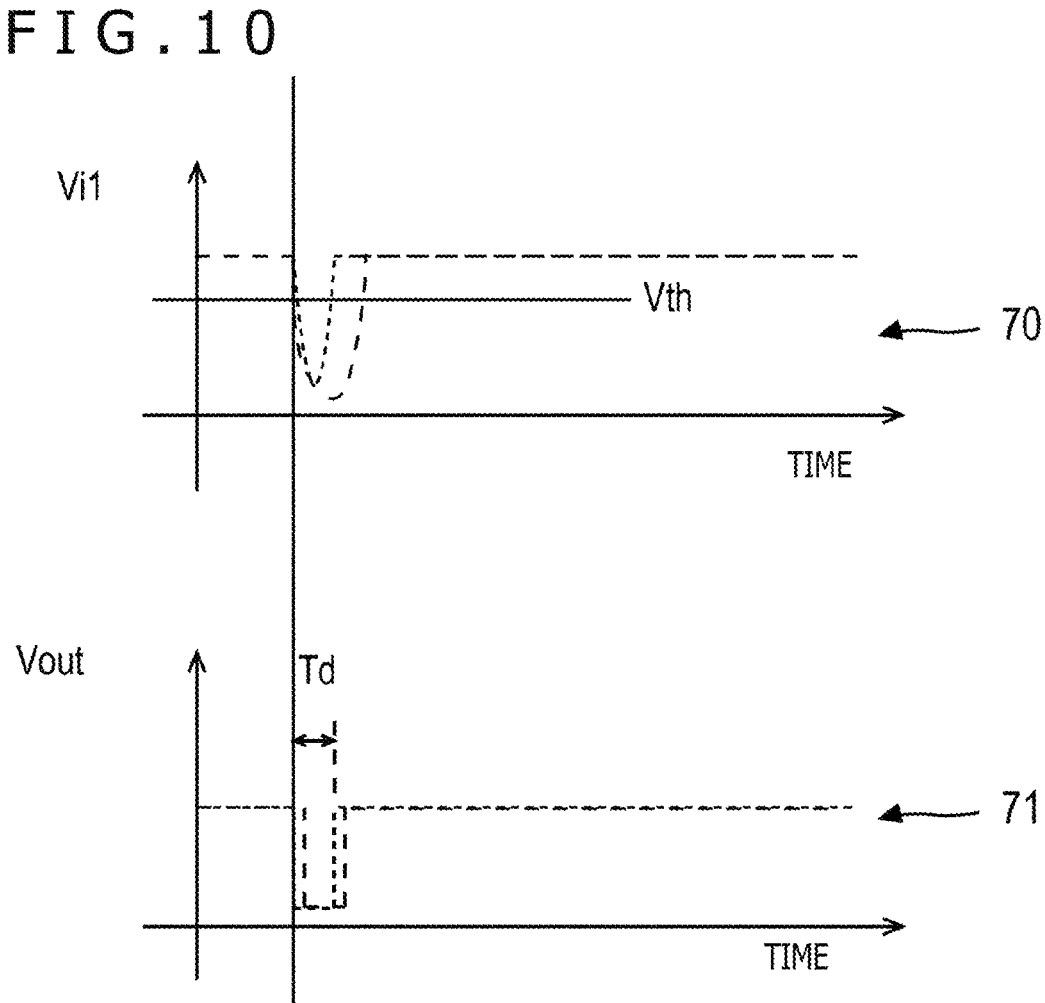

F I G . 1 4
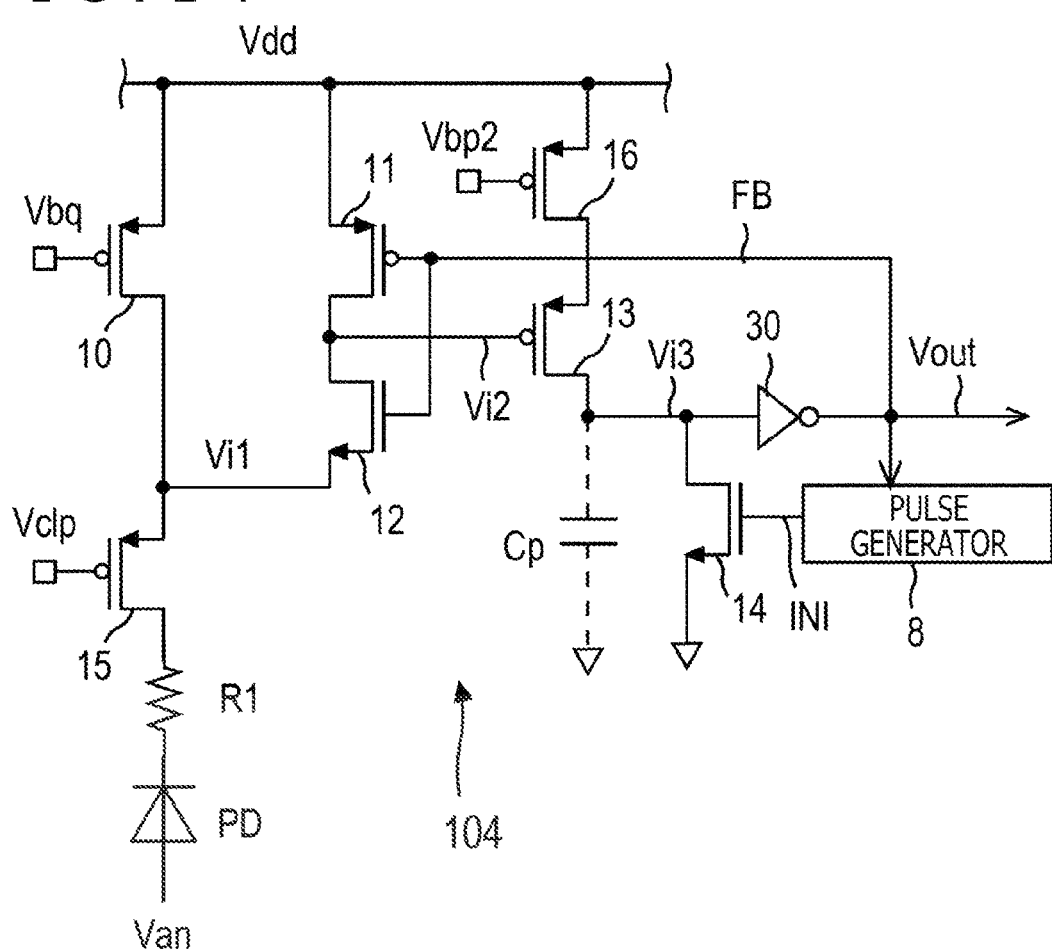

F I G . 1 6
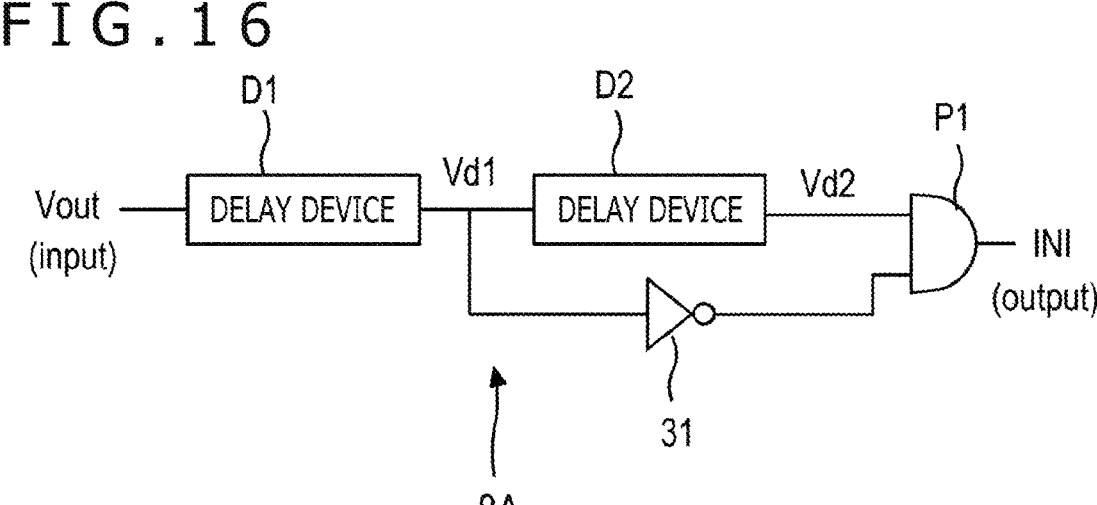

FIG.18

FIG.21
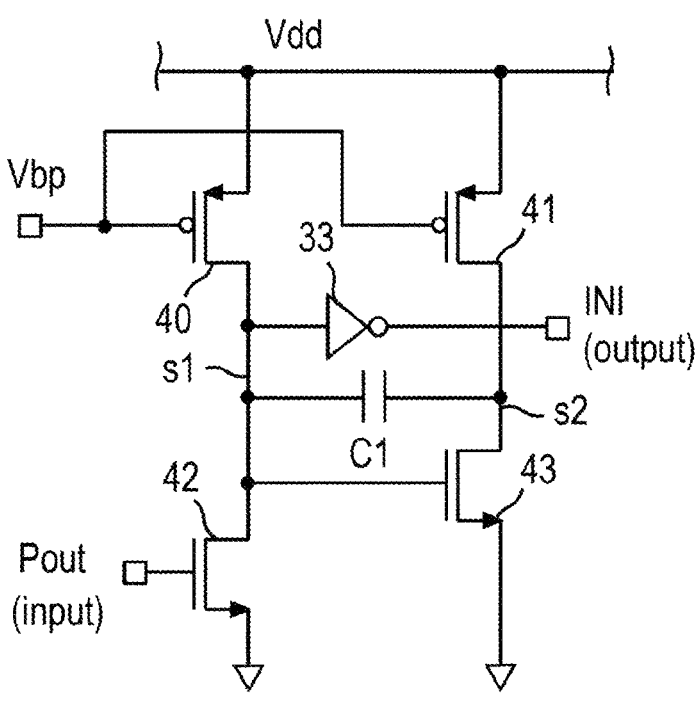
8D

F I G . 2 8
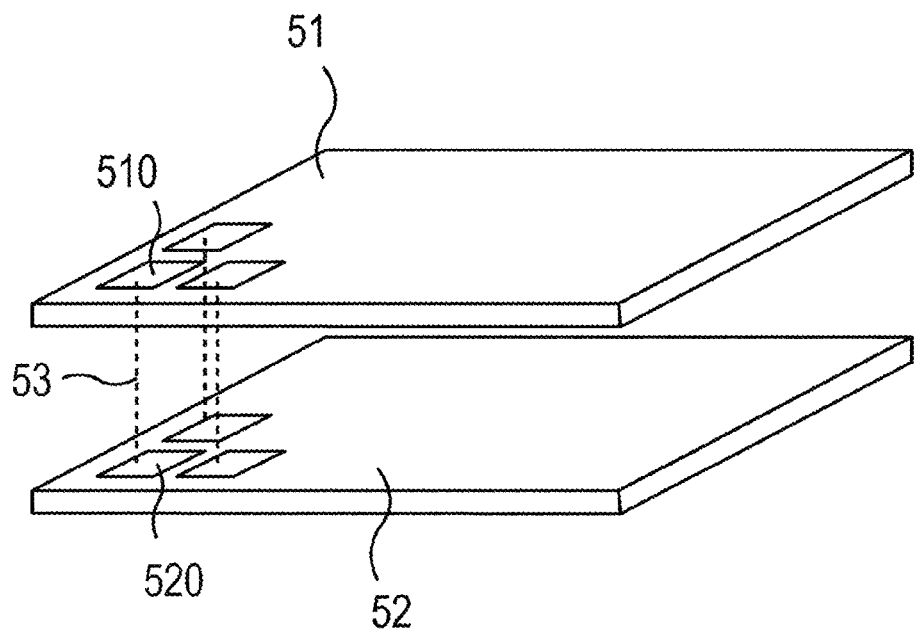

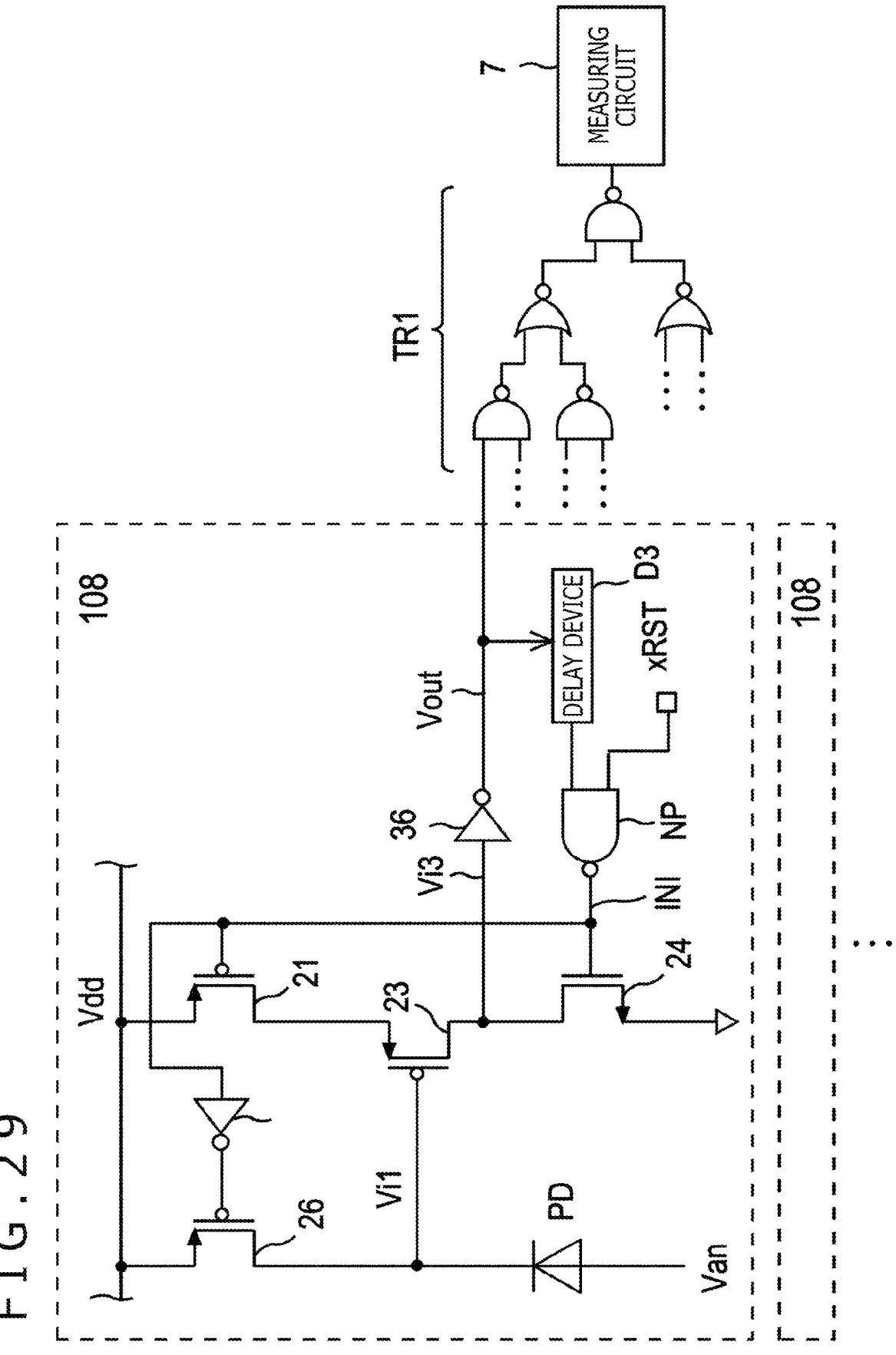
F I G . 2 9

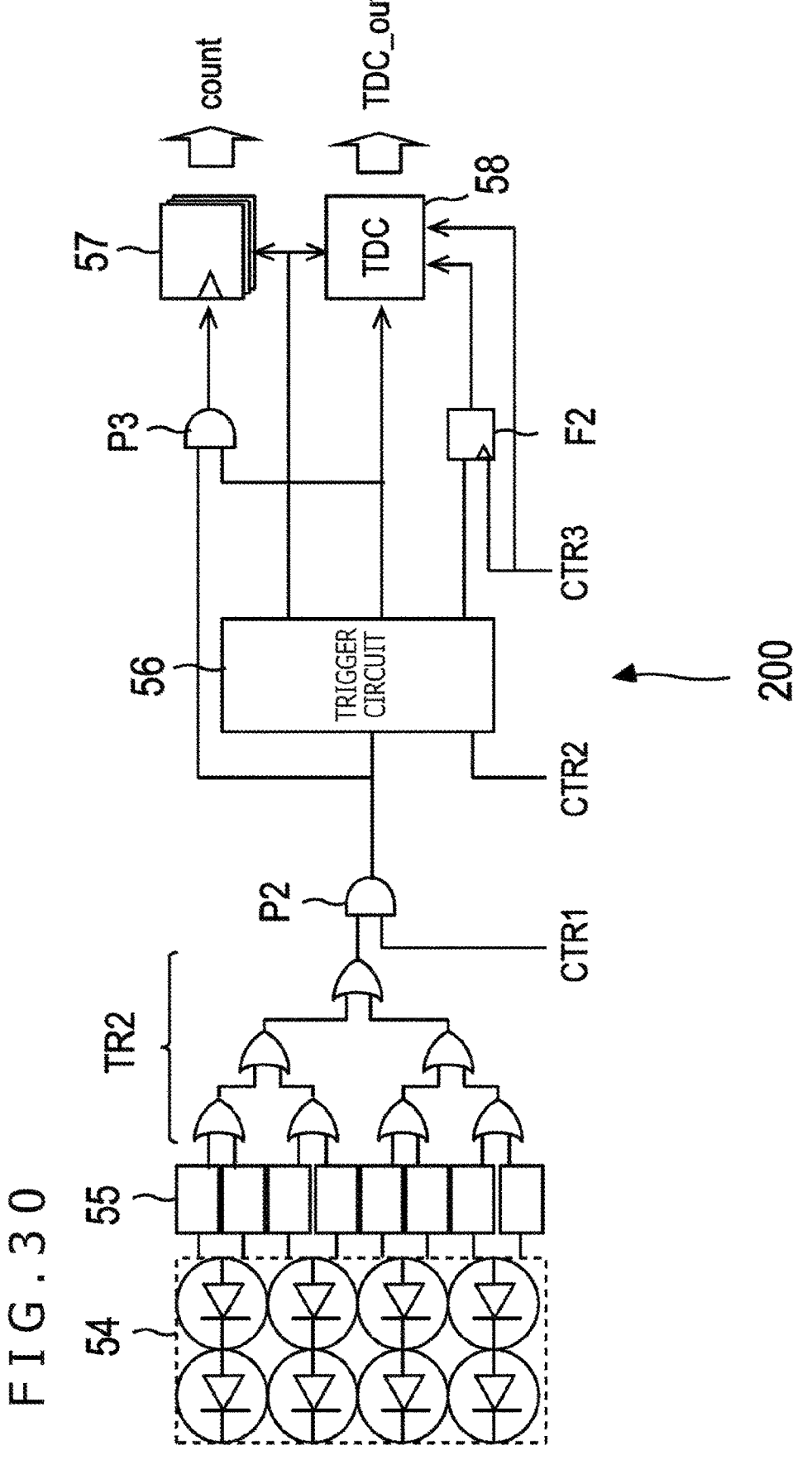
F I G . 3 0

SENSING DEVICE AND DISTANCE MEASURING APPARATUS

TECHNICAL FIELD

The present disclosure relates to a sensing device and a distance measuring apparatus.

BACKGROUND ART

In a plurality of fields including onboard and mobile equipment, there are as increasing number of applications that use a sensing device for measuring a distance to an object on the basis of time of flight (ToF), which is the time it takes for emitted light from a light source to be reflected by the object before reaching a detector. Avalanche photodiodes (APDs) are well-known light-receiving elements used for the sensing device. A voltage equal to or higher than a breakdown voltage is applied across terminals of the APD placed in a Geiger mode. A single photon entering the photodiode then causes an avalanche phenomenon. The ADP that multiplies a single photon by the avalanche phenomenon is called a single-photon avalanche diode (SPAD).

With the SPAD, lowering the voltage across the terminals to the breakdown voltage can stop the avalanche phenomenon. The lowering of the terminal-to-terminal voltage to stop the avalanche phenomenon is referred to as a quench. Recharging the voltage across the terminals of the SPAD to a bias voltage equal to or higher than the breakdown voltage again permits detection of a photon.

CITATION LIST

Patent Literature

[PTL 1]
JP 2019-007877A

Non Patent Literature

[NPL 1]
Matteo Perenzoni, et.al, "A 64×64-Pixels Digital Silicon Photomultiplier Direct TOF Sensor With 100-MPhotons/s/pixel Background Rejection and Imaging/Altimeter Mode With 0.14% Precision Up To 6 km for Spacecraft Navigation and Landing," JSSC2017
[NPL 2]
Cristiano Niclass, et.al, "A 0.18 μm CMOS SoC for a 100 m-Range 10 fps 200×96-Pixel Time-of-Flight Depth Sensor," ISSCC2013

SUMMARY

Technical Problem

In a high-illuminance environment, for example, there may be cases where sensing devices cannot be recharged or where the recharging time is prolonged. In such cases, the accuracy of detecting photons is dropped. To measure a distance with high accuracy requires a sensing device and a distance measuring apparatus that support a wide dynamic range.

The present disclosure thus provides a sensing device and a distance measuring apparatus capable of detecting photons with high accuracy regardless of the environmental illuminance.

Solution to Problem

According to one embodiment of the present disclosure, there may be provided a sensing device including a photodetector, a load element connected interposingly between the photodetector and a first reference potential, a first transistor of a first conductivity type configured to be turned on according to a voltage of a first signal line interposed between the photodetector and the load element, a second transistor of the first conductivity type configured to turn on a state between the first reference potential and the first transistor according to a current of the first transistor or a voltage of a second signal line, a third transistor of a second conductivity type configured to turn on a state between the first transistor and a second reference potential according to the voltage of the second signal line, and a first inverter connected interposingly between a third signal line and a fourth signal line, the third signal line being interposed between the first transistor and the third transistor.

The sensing device may further include a pulse generator configured to output a pulse onto the second signal line according to a voltage of the fourth signal line.

The pulse generator may be configured such that, when a voltage level on the fourth signal line is changed, the pulse generator outputs a pulse onto the second signal line, following a time delay.

The sensing device may further include a first resistor connected interposingly between the load element and the photodetector, and a fourth transistor of the first conductivity type connected in series to the first resistor.

The sensing device may further include a second inverter connected to the second signal line. The load element may be a fifth transistor of the first conductivity type. The fifth transistor may be configured to be turned on according to as output voltage from the second inverter.

The sensing device may further include a sixth transistor of the second conductivity type configured to turn on a state between the second reference potential and the second signal line according to the voltage of the second signal line, in which the load element is a fifth transistor of the first conductivity type configured to be turned on according to the voltage of the second signal line.

The pulse generator may include a first delay device, a second delay device connected in series to the first delay device, an AND circuit connected to a downstream side of the second delay device, and a third inverter connected interposingly between the first delay device and the AND circuit, the first delay device being connected to the fourth signal line, the AND circuit having a downstream side connected to the second signal line.

The pulse generator may include an inverter chain.

The pulse generator may include a flip-flop and a fourth inverter connected to a Q terminal of the flip-flop, the flip-flop having a D terminal connected to the fourth signal line, the fourth inverter having an output side connected to the second signal line.

The pulse generator may include a source-grounded two-stage amplification circuit, a first current source connected to a first stage of the two-stage amplification circuit, a second current source connected to a second stage of the two-stage amplification circuit, a capacitor connected interposingly between the first stage and the second stage of the two-stage amplification circuit, and a fifth inverter connected to the first stage of the two-stage amplification circuit, the two-stage amplification circuit having an input terminal connected to the fourth signal line, the fifth inverter having an output terminal connected to the second signal line.

The photodetector may be mounted on a first substrate connected electrically via Cu—Cu connections to a second substrate on which other elements are mounted.

The photodetector may include an avalanche photodiode.

According to another embodiment of the present disclosure, there may be provided a distance measuring apparatus having a plurality of sensing devices, the distance measuring apparatus including a light source, a logic circuit configured to output a result of an OR operation on output voltages from the plurality of sensing devices, and a measuring circuit configured to measure a distance to an object on the basis of a timing at which light is emitted from the light source and of a signal output from the logic circuit.

The distance measuring apparatus may further include a control circuit connected to the second signal lines of the plurality of sensing devices, in which the control circuit is configured to output a pulse onto the second signal lines on the basis of a signal input to the measuring circuit from the fourth signal line of at least any one of the sensing devices.

According to a further embodiment of the present disclosure, there may be provided a sensing device including a photodetector, a load element connected interposingly between the photodetector and a first reference potential, a seventh transistor of a second conductivity type configured to turn on a state between the photodetector and a sixth signal line according to a voltage of a fifth signal line, an eighth transistor of a first conductivity type configured to turn on a state between the first reference potential and the seventh transistor according to the voltage of the fifth signal line, a ninth transistor of the first conductivity type configured to turn on a state between the first reference potential and a seventh signal line according to a voltage of the sixth signal line, a tenth transistor of the second conductivity type configured to turn on a state between the seventh signal line and a second reference potential according to a voltage of an eighth signal line, and a sixth inverter connected interposingly between the seventh signal line and a ninth signal line, in which the fifth signal line is connected to the ninth signal line.

The sensing device may further include a pulse generator configured to output a pulse onto the eighth signal line according to a voltage of the ninth signal line.

The sensing device may further include a first resistor connected interposingly between the load element and the photodetector, and a fourth transistor of the first conductivity type connected in series to the first resistor.

The sensing device may further include an eleventh transistor configured to turn on a state between the first reference potential and the ninth transistor according to a voltage applied to a first control electrode.

The sensing device may further include a twelfth transistor configured to turn on a state between the seventh signal line and the tenth transistor according to a voltage applied to a second control electrode.

According to an even further embodiment of the present disclosure, there may be provided a sensing device including a photodetector, a load element connected interposingly between the photodetector and a first reference potential, a seventh transistor of a second conductivity type configured to turn on a state between the photodetector and a sixth signal line according to a voltage of a fifth signal line, an eighth transistor of a first conductivity type configured to turn on a state between the first reference potential and the seventh transistor according to the voltage of the fifth signal line, a ninth transistor of the first conductivity type configured to turn on a state between the first reference potential and a seventh signal line according to a voltage of the sixth signal line, a tenth transistor of the second conductivity type configured to turn on a state between the seventh signal line and a second reference potential according to a voltage of an eighth signal line, a sixth inverter connected to the seventh signal line, a seventh inverter connected interposingly between the sixth inverter and a ninth signal line, a third delay device connected to the ninth signal line, a NOR circuit configured to output onto the eighth signal line a result of a NOR operation on an output voltage from the third delay device and on a voltage of a tenth signal line, and a NAND circuit configured to output onto the fifth signal line a result of a NAND operation on a voltage of the ninth signal line and on a voltage of the eighth signal line.

BRIEF DESCRIPTION OF DRAWINGS

FIG. 3 is a detailed circuit diagram of the exemplary sensing device according to the present disclosure.

FIG. 4 is a set of graphs depicting exemplary voltage signals and photon count numbers with the sensing device according to the present disclosure.

FIG. 8 is a set of graphs depicting exemplary voltage signals and photon count numbers with the sensing device in FIG. 3.

FIG. 9 is a set of graphs depicting exemplary pulses with the sensing device is FIG. 3.

FIG. 10 is a set of graphs depicting exemplary pulses with the sensing device according to the present disclosure.

FIG. 14 is a circuit diagram depicting an exemplary sensing device in a fourth variation.

FIG. 16 is a circuit diagram depicting an exemplary pulse generator including delay devices.

FIG. 18 is a circuit diagram depicting an exemplary pulse generator including as inverter chain.

FIG. 21 is a circuit diagram depicting an exemplary pulse generator including a source-grounded amplifier.

FIG. 24 is a circuit diagram depicting an exemplary sensing device in a seventh variation.

FIG. 26 is a circuit diagram depicting an exemplary sensing device in a ninth variation.

FIG. 27 is a circuit diagram depicting an exemplary sensing device in the ninth variation.

FIG. 28 is a perspective diagram depicting an example of how to mount sensing devices with use of Cu—Cu connections.

FIG. 29 is a circuit diagram depicting an exemplary circuit supporting dToF-based distance measurement.

FIG. 30 is a schematic diagram depicting an exemplary circuit including a counter and a TDC.

DESCRIPTION OF EMBODIMENTS

Some preferred embodiments of the present disclosure are described below in detail with reference to the accompanying drawings. It is to be noted that, throughout the ensuing description and the appended drawings, like reference signs designate like or corresponding constituent elements having substantially similar functions, and the explanations of such elements will be omitted where they are redundant.

Figure 1:
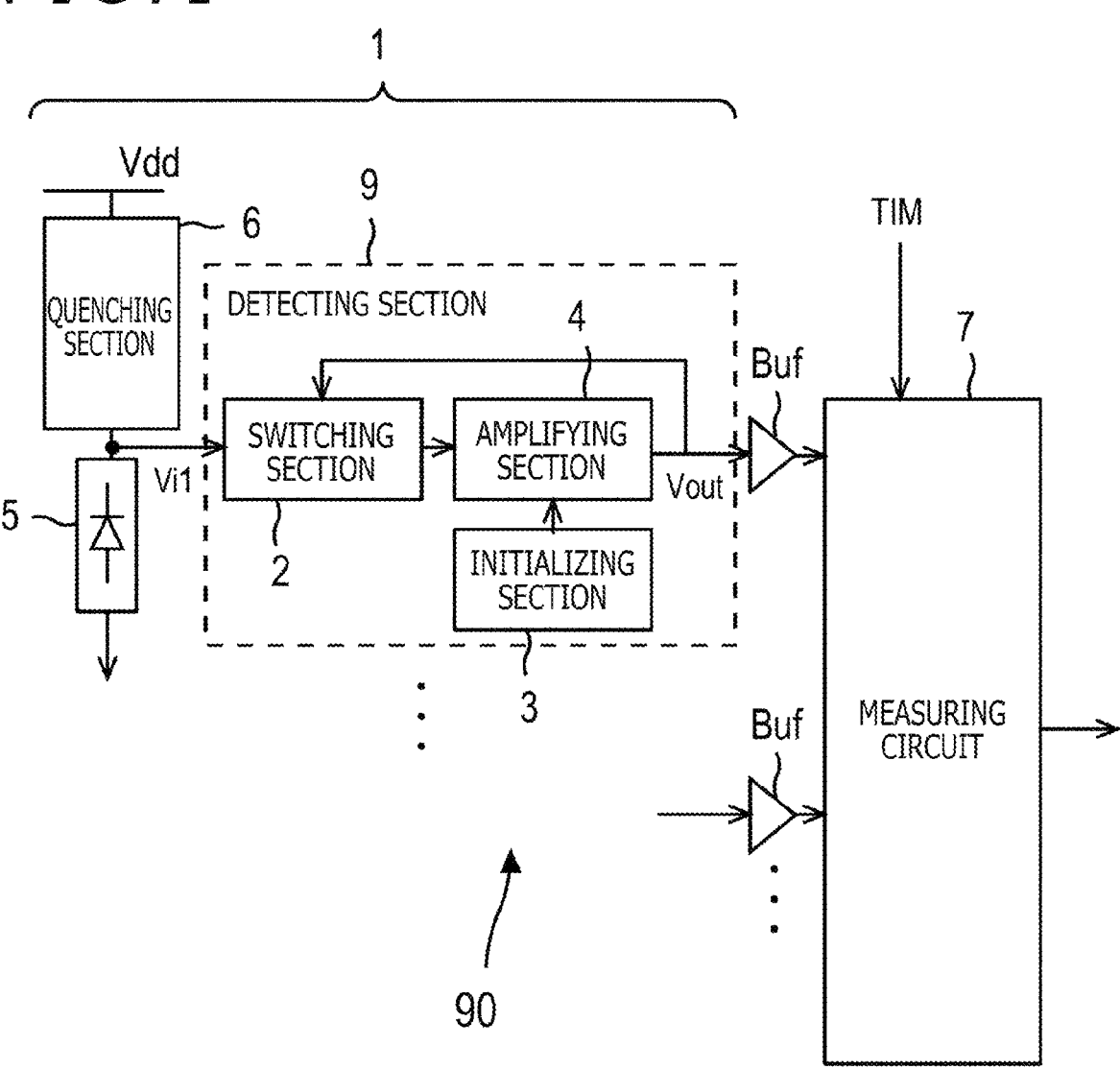
FIG. 1 is a block diagram schematically depicting an exemplary sensing device according to the present disclosure.

The block diagram of FIG. 1 schematically depicts an exemplary sensing device according to the present disclosure. A sensing device 1 in FIG. 1 includes a detector 5, a quenching section 6, and a detecting section 9. The detecting section D1 has a switching section 2, an initializing section 3, and an amplifying section 4 as its constituent elements. For example, a photodetector such as a photodiode can be used as the detector 5. In the description that follows, a single-photon avalanche diode (SPAD) is assumed to be used as the exemplary detector 5. Alternatively, sensors that detect other physical information may be utilized as the detector 5. It is possible to mount a distance measuring apparatus 90 that combines the sensing device 1 with a measuring circuit 7.

Figure 2:
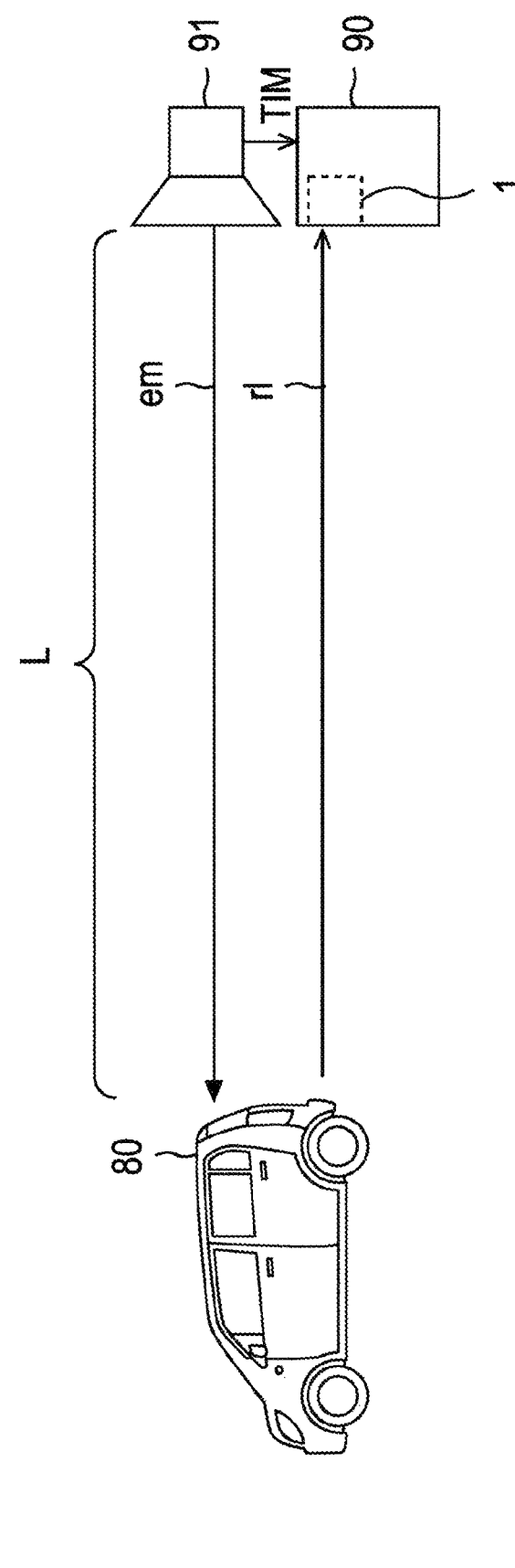
FIG. 2 is a schematic diagram depicting an example of measuring a distance with use of a sensing device.

FIG. 2 is a schematic diagram depicting an example of measuring a distance with use of a sensing device. FIG. 2 illustrates a case where a distance to an object 80 is measured by use of a light source 91 and the distance measuring apparatus 90. The light source 91 emits light em to the object 80. The distance measuring apparatus 90 detects reflected light r1 of the light em from the object 80 by use of the sensing device 1. Whereas the object 80 is a vehicle in FIG. 2, there are no restrictions on a type of object. In the following, provided is a description regarding the sensing device according to the present disclosure with reference to FIGS. 1 and 2.

A photon entering the detector 5 causes an avalanche phenomenon changing a voltage of a signal line Vi1. In the quenching section 6, there occurs a voltage drop reflecting a current, so that a voltage between terminals of the detector 5 drops to a breakdown voltage, thereby causing the avalanche phenomenon to stop. The switching section 2 switches between a detecting operation and a reset operation, the detecting operation involving detect on of a photon response signal, the reset operation resetting the own internal state. The initializing section 3 changes a voltage level inside the detecting section 9 at reset operation such that the detecting section 9 can again detect a photon.

When the detector 5 reacts with a photon at detecting operation, the detecting section 9 outputs a corresponding pulse through a signal line Vout. The measuring circuit 7 is connected to a downstream side of the detecting section 9 (sensing device 1) via a buffer Buf. The buffer Buf is also known as a sampler circuit that digitizes the signal output from the detecting section 9. As depicted in FIG. 1, multiple sensing devices and multiple buffers Buf may be connected to the measuring circuit 7.

The measuring circuit 7 includes a TDC (Time to Digital Converter) and a histogram generator, for example. On the basis of information regarding a light emission time $t_0$ input from a signal line TIM, the TDC measures the time that elapses from a light emission time $t_0$ to a photon incident time $t_1$. The elapsed time corresponds to the time of flight (ToF) during which the light em emitted from the light source 91 is reflected by the object 80 before reaching the detector 5. The histogram generator accumulates the results of multiple measurements of the time of flight to generate a histogram. Taking the multiple measurements of the time of flight makes it possible to distinguish between background light (ambient light) and the reflected light r1 emitted from the light source. At the time of generating a histogram, calculations may be made to average the multiple measurements of the time of flight. Obtaining a peak in the histogram permits calculation of the distance between the sensing device 1 and the object 80. For example, if "c" represents light speed, the distance between the sensing device 1 and the object 80 can be calculated by use of the formula $L=c/2(t_1-t_0)$. It is to be noted that what has been described above is only an example of processing of the measuring circuit 7. The measuring circuit 7 may perform processing of different contents instead.

For example, the measuring circuit 7 can be mounted through use of a hardware circuit such as an FPGA (Field Programmable Gate Array) or an ASIC (Application Specific Integrated Circuit). Alternatively, the function of the measuring circuit 7 may be implemented by a CPU (central processing unit) and programs executed thereby. The measuring circuit 7 may include a memory or storage that holds the programs and data necessary for executing the programs.

The circuit diagram of FIG. 3 depicts an exemplary circuit corresponding to the sensing device 1. A circuit 100 in FIG. 3 includes a photodiode PD, a pulse generator 8, transistors 10, 11, 12, 13, and 14, and an inverter 30. The transistors 10, 11, and 13 are P-MOS transistors. The transistors 12 and 14 are Ni-MCS transistors. The photodiode PD is an example of the above-described detector 5. The transistor 10 corresponds to the above-described quenching section 6. Incidentally, the transistor 10 corresponds to a load element of the photodiode PD. The transistor 10 may be replaced by a resistor as the load element. The parts downstream of the signal line Vi1 in the circuit 100 correspond to the above-described detecting section 9.

The configuration of the circuit 100 is explained first.

The sources of the transistors 10, 11, and 13 are connected to a power supply potential Vdd. On the other hand, the drain of the transistor 10 is connected to the cathode of the photodiode PD. In addition, the cathode of the photodiode PD is connected to the source of the transistor 12 via the signal line Vi1. A voltage Van is applied to the anode of the photodiode PD. The value of the voltage Van can be determined in such a manner that a reverse voltage equal to or higher than the breakdown voltage is applied between the cathode and the anode (i.e., between the terminals) of the photodiode PD. The drain of the transistor 12 is connected to the drain of the transistor 11 and to the gate of the transistor 13. A signal line Vi2 connects a node interposed between the drains of the transistors 11 and 12 with the gate of the transistor 13.

The drain of the transistor 13 is connected to the input terminal of the inverter 30 and to the drain of the transistor 14 via a signal line Vi3. A signal line Vout is connected to the output terminal of the inverter 30. In addition, the output terminal of the inverter 30 is also connected to the input terminal of the pulse generator 8. The output terminal of the inverter 30 is further connected to the gates of the transistors 11 and 12 via a signal line FB. Meanwhile, the gate of the transistor 14 is connected to the output terminal of the pulse generator 8 via a signal line INI. The source of the transistor 14 is connected to a ground potential. For example, a reference potential for the circuit 100, a reference potential for the signal lines, or a ground voltage can be used as the ground potential. However, it does not matter what type of potential is used as the ground potential. It is to be noted that, in the circuit 100, a parasitic capacitance Cp between the signal line Vi3 and the ground potential is indicated. The sources of the transistors 10, 11, and 13 may all be connected to the common power supply potential Vdd. Also, the source of at least any one of the transistors 10, 11, and 13 may be connected to a different power supply potential.

Figure 17:
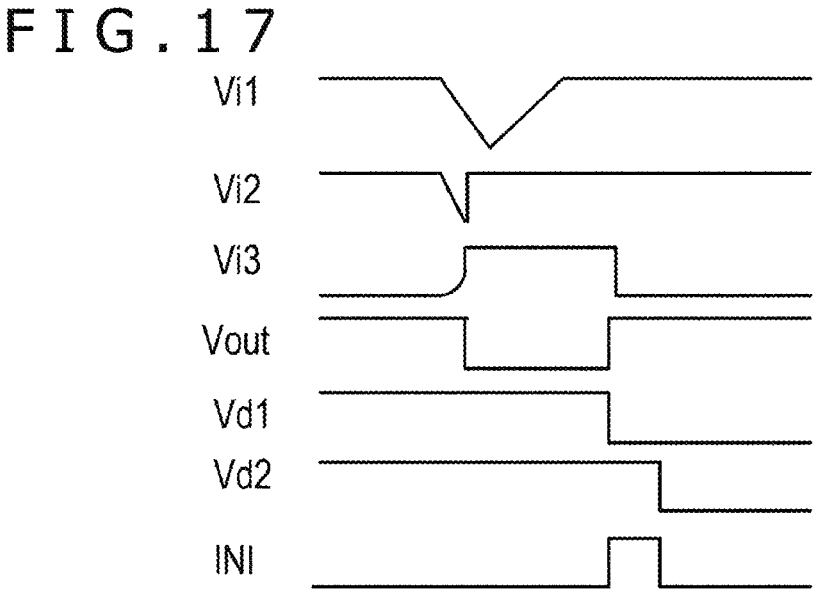
FIG. 17 is a graph depicting exemplary signal waveforms of a sensing device including the pulse generator in FIG. 16.
Figure 20:
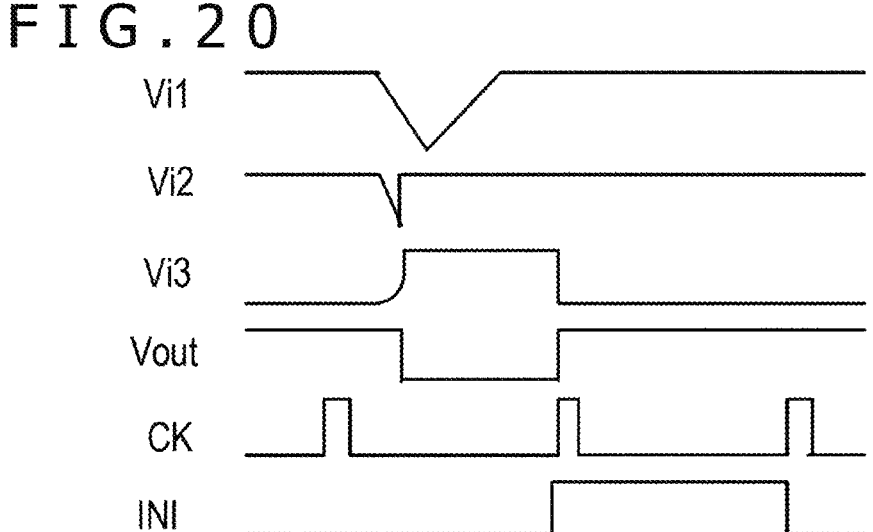
FIG. 20 is a graph depicting exemplary signal waveforms of a sensing device including the pulse generator in FIG. 19.
Figure 23:
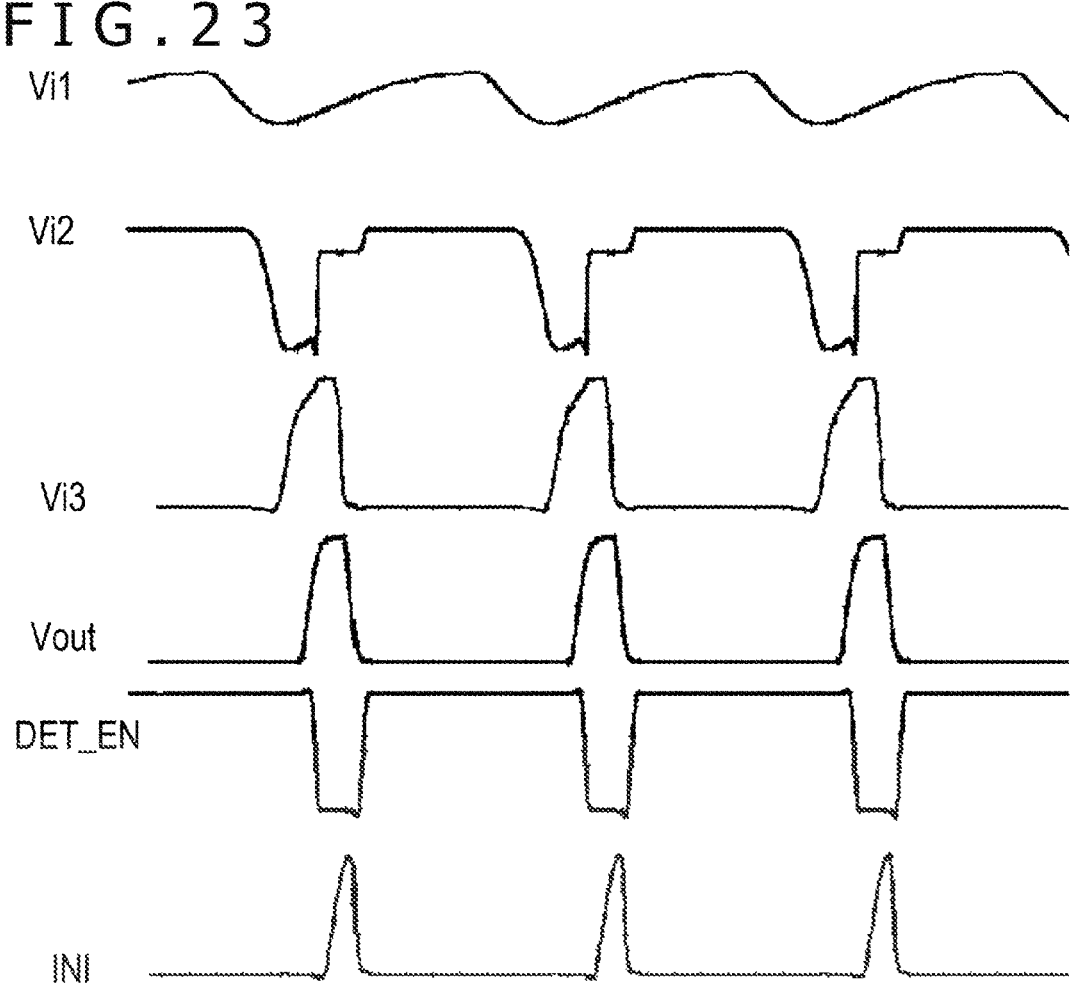
FIG. 23 is a graph depicting exemplary signal waveforms of the sensing device is the sixth variation.

FIG. 4 depicts exemplary voltage signals and photon count numbers with the sensing device 1. A graph 61 in FIG. 4 depicts a voltage waveform on the signal line Vi1 in the circuit 100. A line th in the graph 61 indicates a threshold voltage of the inverter 30. A graph 62 depicts a voltage waveform on the signal line Vi2 in the circuit 100. A graph 63 depicts a voltage waveform on the signal line Vout in the circuit 100. On the other hand, a graph 64 depicts exemplary photon count numbers with the measuring circuit 7 in the circuit 100. FIGS. 17, 20, and 23 also depict exemplary voltage waveforms on the signal lines Vi1, Vi2, and Vi3.

The workings of the circuit 100 are explained next,

When the photodiode PD reacts with a photon causing the current between the cathode and the anode of the photodiode to increase, the voltage of the signal line Vi1 drops (graph 61) in keeping with a voltage drop between the source and the drain of the transistor 10. As a result, the voltage of the signal line Vi2 connected to the signal line Vi1 via the transistor 12 is changed from HIGH to LOW (graph 62). When the LOW voltage is applied to the gate of the transistor 13, a state between the source and the drain of the transistor 13 is turned on. The voltage of the signal line Vi3 is brought HIGH by the power supply potential Vdd. Upon receiving input of a HIGH signal from the signal Vi3, the inverter 30 outputs a LOW signal. In the circuit 100, at the time of detecting a photon, the signal line Vout outputs a LOW-level (negative polarity) pulse. Given the LOW-level pulse, the downstream measuring circuit 7 can perform the above-described distance measuring process.

At this point, the LOW voltage is applied to the gates of the transistors 11 and 12. The state between the source and the drain of the transistor 11 is turned on. In addition, state between the drain and the source of the transistor 12 is turned off. As a result, the signal line Vi2 is electrically disconnected from the signal line Vi1, with the voltage brought HIGH by the power supply potential Vdd. With the HIGH voltage applied to the gate of the transistor 13, the state between the source and the drain of the transistor 13 is turned off.

When the output voltage of the inverter 30 becomes LOW, the pulse generator 8 outputs a HIGH-level (positive polarity) pulse onto the signal line INI, following a predetermined time delay. As a result, the HIGH-level voltage is applied to the gate of the transistor 14, turning on the state between the drain and the source of the transistor 14. This causes the ground potential to initialize the signal line Vi3 to the LOW voltage. With The voltage of the signal line Vi3 brought LOW, the output voltage of the inverter 30 becomes HIGH. This terminates the LOW-level pulse on the signal line Vout.

The duration of the LOW-level pulse output from the signal line Vout can be varied by adjusting the time delay from the time at which the LOW-level pulse from the inverter 30 is input to the pulse generator 8 to the time at which the pulse generator 8 generates the HIGH-level pulse. When the output voltage of the inverter 30 becomes HIGH, the HIGH voltage is applied to the gates of the transistors 11 and 12. This turns off the state between the source and the drain of the transistor 11. In addition, the state between the drain and the source of the transistor 12 is turned on. Because conduction is established between the signal lines Vi1 and Vi2, it is again possible to detect a photon.

The voltages inside the circuit 100 are reset every time a pulse is output, following reaction with a photon. As a result, even in a high-illumination environment indicated by Lh1 in the graphs 61 through 64, it is possible to detect photons. When the circuit 100 is used, the photon count numbers with the measuring circuit 7 register an absolutely monotonous increase in keeping with illumination levels (graph 64)

Figure 5:
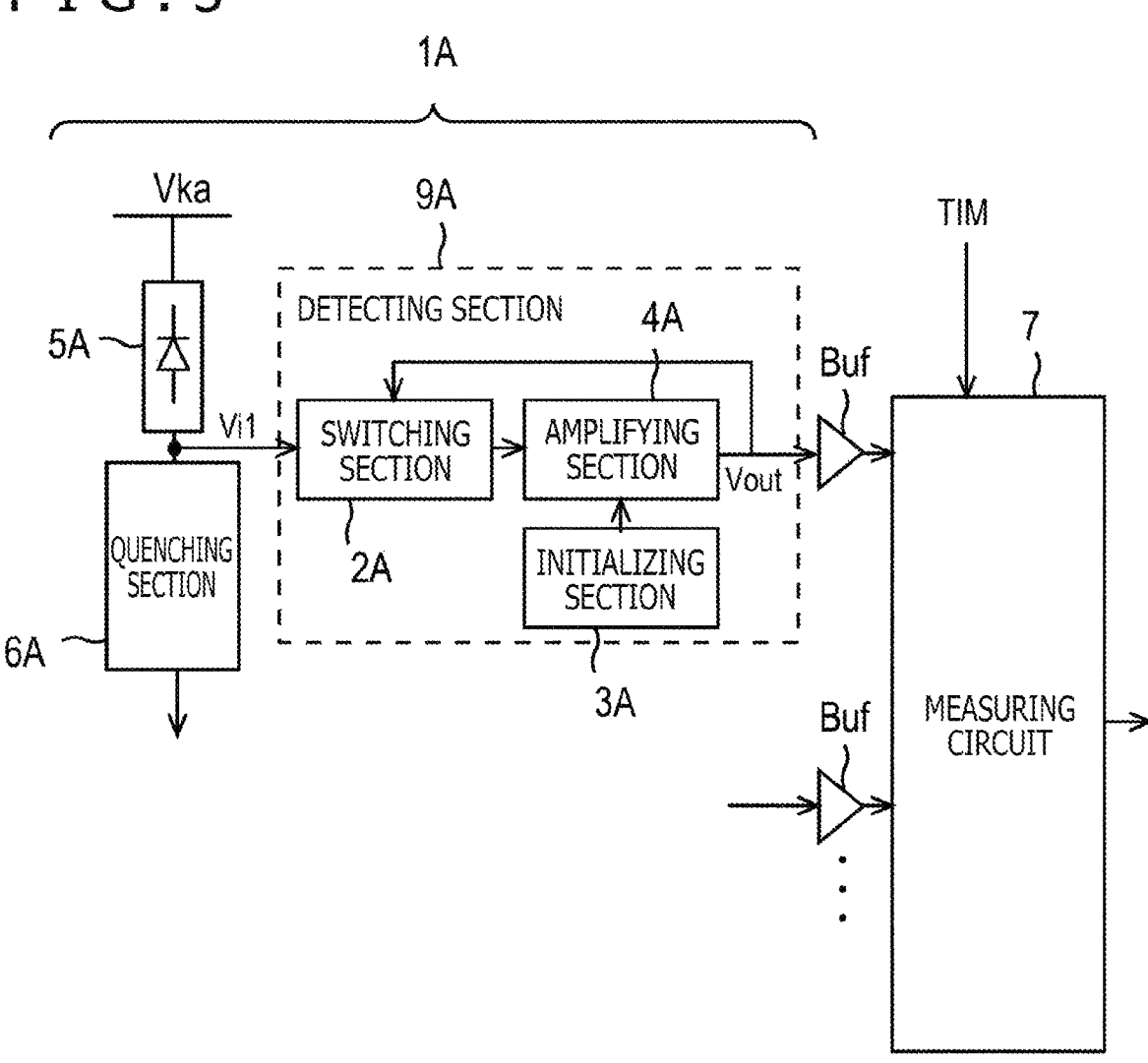
FIG. 5 is a block diagram depicting an exemplary sensing device of which polarities are reversed.

The block diagram of FIG. 5 depicts an exemplary sensing device of which the polar es are reversed. In a sensing device 1A in FIG. 5, a quenching section 6A and a detector 5A are connected is the reverse order of their counterparts in the sensing device 1. That is, the sensing device according to the present disclosure may use a circuit of which the polarities are the reverse of those of the circuit 100 in FIG. 3. In order to reverse the polarities, the N-MOS transistors in the circuit 100 need only be replaced by P-MOS transistors, and the P-MOS transistors in the circuit 100 by N-MOS transistors. In a case where the detector 5A is a photodiode such as an avalanche diode (APD), a positive bias voltage is applied to the cathode of the photodiode. Not only the circuit 100 but also a plurality of circuits to be explained below can adopt configurations in which the polarities are reversed.

The sensing device according to the present disclosure may include a photodetector, a load element, a seventh transistor of the second conductivity type, an eighth transistor of the first conductivity type, a ninth transistor of the first conductivity type, a tenth transistor of the second conductivity type, and a sixth inverter. The load element is connected interposingly between the photodetector and a first reference potential. The seventh transistor turns on the state between the photodetector and a sixth signal line according to a voltage of a fifth signal line. The eighth transistor turns on the state between the first reference potential and the seventh transistor according to the voltage of the fifth signal line. The ninth transistor turns on the state between the first reference potential and a seventh signal line according to a voltage of the sixth signal line. The tenth transistor turns on the state between the seventh signal line and a second reference potential according to a voltage of an eighth signal line. The sixth inverter is connected interposingly between the seventh signal line and a ninth signal line. Also, the fifth signal line is connected to the ninth signal line.

For example, P-MOS transistors can be used as the transistors of the first conductivity type, and N-MOS transistor can be used as the transistors of the second conductivity type. In this case, the power supply potential can be used as the first reference potential, and the ground potential can be used as the second reference potential. It is also possible alternatively to use N-MOS transistors as the transistors of the first conductivity type and P-MOS transistors as the transistors of the second conductivity type. In this case, the ground potential can be used as the first reference potential, and the power supply potential can be used as the second reference potential.

The transistor 10 in FIG. 3 is an example of the load element. It is to be noted that the load element may be a passive component such as a resistor. The transistor 12 is an example of the seventh transistor. The signal line FB is an example of the fifth signal line. The signal line Vi2 in FIG. 3 is an example of the sixth signal line. The transistor 11 is an example of the eighth transistor. The transistor 13 is an example of the ninth transistor. The signal line Vi3 in FIG. 3 is an example of the seventh signal line. The transistor 14 is an example of the tenth transistor. The signal line INI in FIG. 3 is an example of the eighth signal line. The inverter 30 in FIG. 3 is as example of the sixth inverter. The signal line Vout in FIG. 3 is an example of the ninth signal line. For example, an avalanche photodiode can be used as the photodetector.

In addition, the sensing device according to the present disclosure may further include a pulse generator configured in such a manner as to output a pulse onto the eighth signal line according to the voltage of the ninth signal line.

Figure 6:
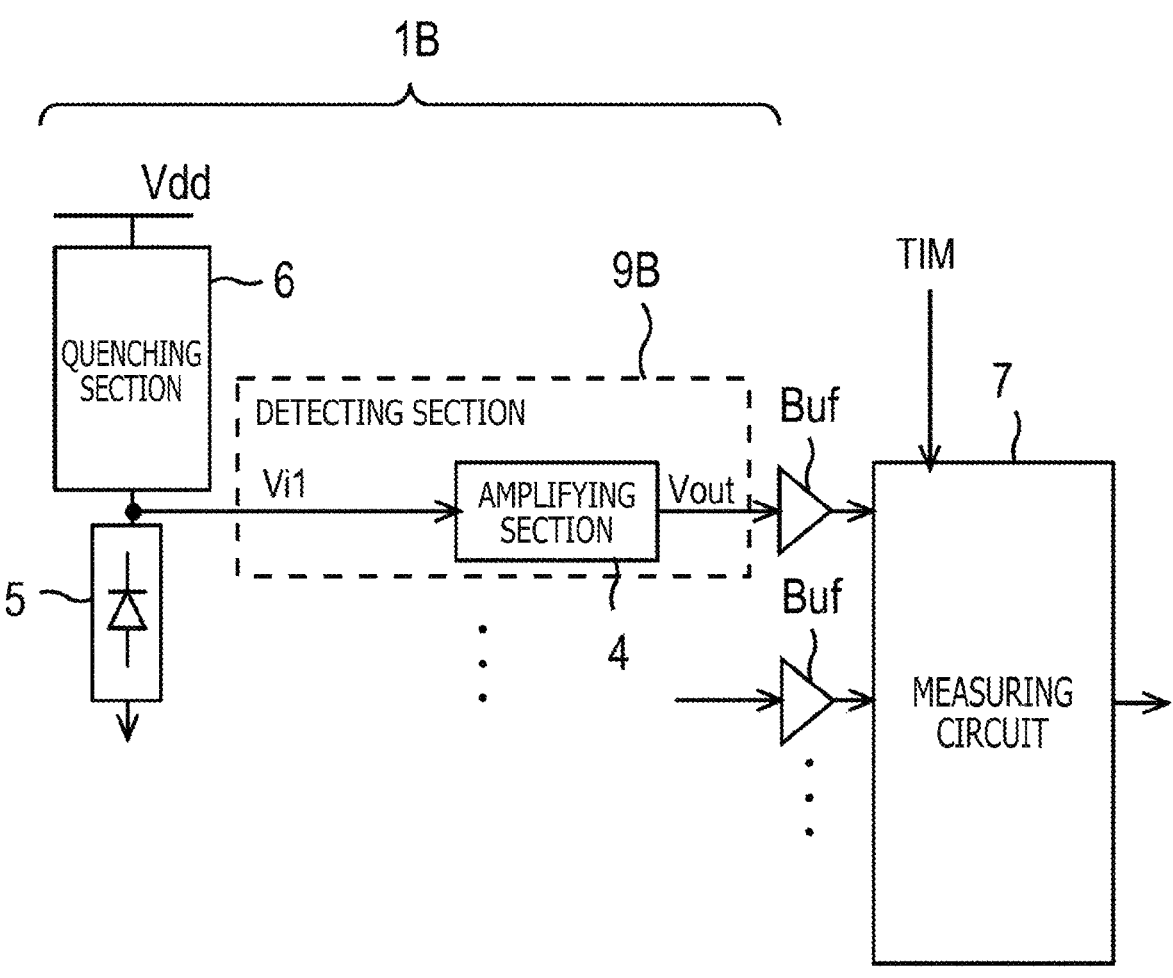
FIG. 6 is a block diagram depicting an exemplary sensing device of which some of the constituent elements are omitted.

FIG. 6 depicts an exemplary sensing device of which some of the constituent elements are omitted. A sensing device 1B in FIG. 3 includes a detector 5, a quenching section 6, and a detecting section 9B. As in FIG. 1, the measuring circuit 7 is connected to the downstream side of the sensing device 1B via the buffer Buf.

Figure 7:
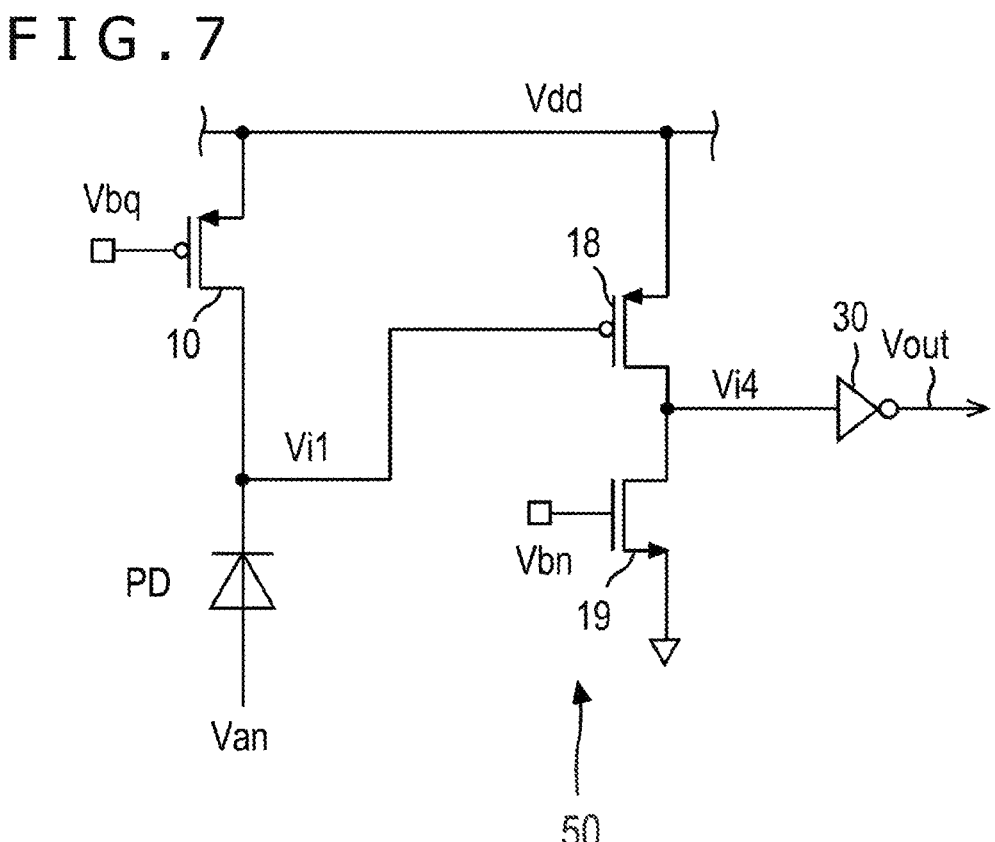
FIG. 7 is a detailed circuit diagram of the sensing device in FIG. 3.

The circuit diagram of FIG. 7 depicts a circuit corresponding to the sensing device 1B. A circuit 50 in FIG. 7 includes a photodiode PD, transistors 10, 18, and 19, and an inverter 30. The transistors 10 and 18 are P-MOS transistors. The transistor 19 is an N-MOS transistor. The source of the transistor 10 is connected to the power supply potential Vdd. In addition, the drain of the transistor 10 is connected to the cathode of the photodiode PD. A voltage Van is applied to the anode of the photodiode. The value of the voltage Van can be determined in such a manner that a reverse voltage equal to or higher than a breakdown voltage is applied between the cathode and the anode (i.e., between the terminals) of the photodiode PD.

In addition, the gate of the transistor 18 is connected via the signal line Vi1 to a node interposed between the drain of the transistor 10 and the cathode of the photodiode PD. The source of the transistor 18 is connected to the power supply potential Vdd. The drain of the transistor 18 is connected to the input terminal of the inverter 30 via a signal line Vi4. In addition, the drain of the transistor 18 is also connected to the drain of the transistor 19. The output terminal of the inverter 30 is connected to the signal line Vout. The source of the transistor 19 is connected to the ground potential. In the circuit 50, the photodiode PD corresponds to the detector 5, and the transistor 10 corresponds to the quenching section 6. In addition, the transistors 18 and 19 and the inverter 30 correspond to the detecting section 9B.

When the photodiode PD reacts with a photon, the current between the cathode and the anode of the photodiode PD increases. As a result, the voltage on the cathode of the photodiode PD drops in keeping with a voltage drop between the source and the drain of the transistor 10. This causes the voltage of the signal line Vi1 to become LOW, thereby applying the LOW voltage to the gate of the transistor 18. This turns on the state between the source and the drain of the transistor 18. The voltage of the signal line Vi4 is brought HIGH by the power supply potential Vdd. Upon receiving input of the HIGH voltage, the inverter 30 outputs the LOW voltage. At the time of detecting a photon, the circuit 50 thus outputs a LOW (negative polarity) pulse.

When the voltage between the cathode and the anode drops to the breakdown voltage, the avalanche current stops. This suppresses the voltage drop between the source and the drain of the transistor 10, causing the voltage of the signal line Vi1 to become HIGH. When the HIGH voltage is applied to the gate of the transistor 18, the state between the source and the drain of the transistor 18 is turned off. When an external control circuit applies a HIGH voltage Vbn to the gate of the transistor 19, the state between the drain and the source of the transistor 19 is turned on. As a result, the signal line Vi4 is disconnected from the power supply potential Vdd and connected to the ground potential. When the voltage of the signal line Vi4 becomes LOW, the inverter 30 outputs the HIGH voltage. The circuit 50 thus stops outputting the LOW pulse.

FIG. 8 depicts exemplary voltage waveforms and photon count numbers with the sensing device 1B. A graph 65 in FIG. 8 depicts an exemplary voltage waveform on the signal line Vi1 in the circuit 50. A graph 66 depicts an exemplary voltage waveform on the signal line Vout in the circuit 50. A graph 67 indicates exemplary photon count numbers with the measuring circuit 7 in the circuit 50. Because the switching section 2 and the initializing section 3 are omitted in the sensing device 1B, the above-described reset operation is not carried out. When the sensing device 1B is used in a high-illuminance environment, there is a possibility that the detector 5 may again react with a photon before the quenching section 6 brings the voltage between the terminals of the detector 5 down to the breakdown voltage. In such a case, the voltage of the signal line Vi1 remains dropped (Lh2 in graph 65), so that no pulse can be generated (Lh2 in graph 66). As a result, as indicated by Lh2 in the graph 67, the photon count numbers do no increase monotonically, which makes it difficult to detect photons correctly. It is to be noted that, for the sake of comparison, lines Lr in the graphs 65 through 67 represent graphs corresponding to the time when the sensing device 1B operates normally.

The graphs in FIG. 9 depict exemplary pulses with the sensing device 1B. A graph 68 in FIG. 9 depicts an exemplary voltage waveform on the signal line Vi1 in the circuit 50. The graph 68 indicates that process-induced variations in properties can lead to two types of sensing devices: one with a short recharging time, and another with a long recharging time. The width of the pulse output onto the signal line Vi1 is proportional to the recharging time. As a result, when the voltage waveform on the signal line Vi1 varies as indicated by a graph 69, the width of the pulse output onto the signal line Vout also varies. In order to prevent missed detection of photons, it is preferred that both dead time and recharging time be as short as possible. However, if the width of the pulse output onto the signal line Vout is too narrow, it becomes difficult for the downstream measuring circuit 7 to detect photons.

Meanwhile, the graphs in FIG. 10 depict exemplary pulses with the sensing device (circuit 100) according to the present disclosure. A Graph 70 in FIG. 10 depicts an exemplary voltage waveform on the signal line Vi1 in the circuit 100. Also in the graph 70, variations occur in the recharging time, depending on the sensing device. However, the circuit 100 detects a falling edge of the voltage signal on the signal line Vi1 and thereupon outputs a pulse of a certain time width (Td) onto the signal line Vout. As a result, regardless of the variations in the recharging time of the sensing device, it is possible to output a pulse of a certain width to the downstream measuring circuit 7. The circuit 100 can be configured in such a manner that the pulse width Td can be adjusted. This makes it possible to control the pulse width and the pulse output timing in a manner adjusting to the measuring circuit 7. Because the circuit 100 has its internal voltages reset every time a pulse is output, the circuit 100 can return quickly to a state in which it is ready to detect the next photon.

Figure 11:
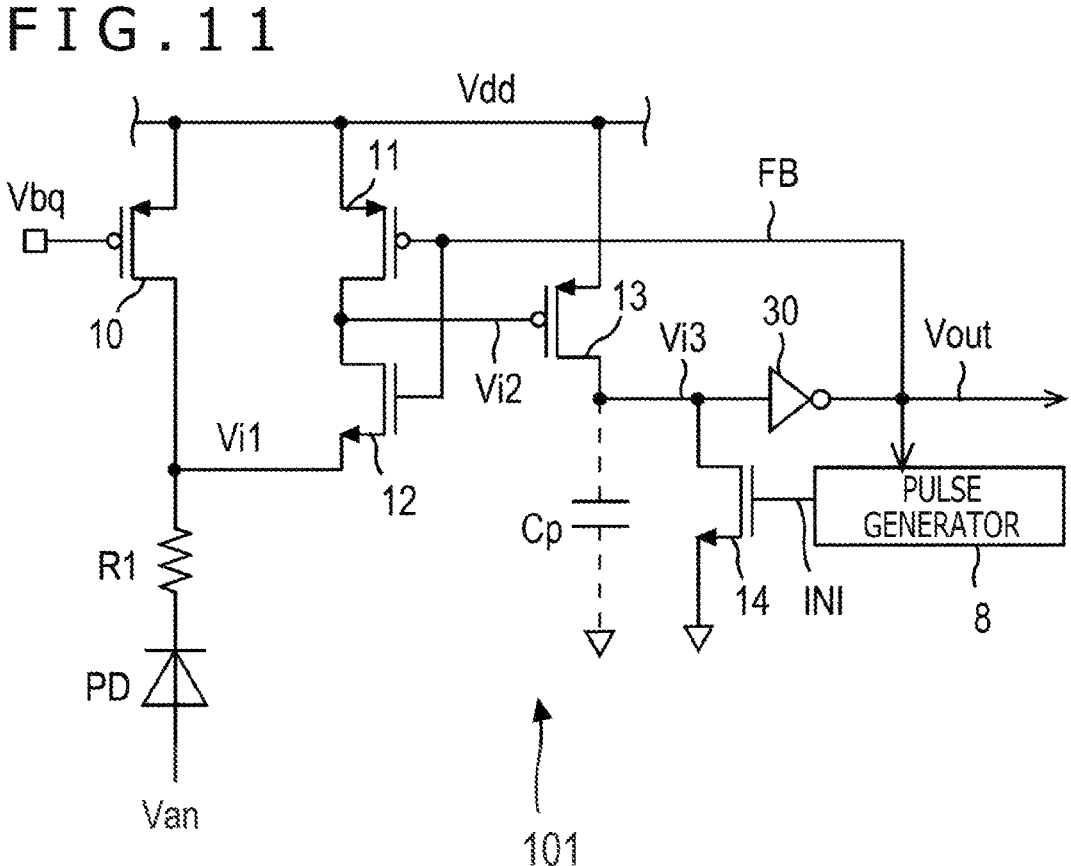
FIG. 11 is a circuit diagram depicting an exemplary sensing device in a first variation.

The circuit diagram of FIG. 11 depicts an exemplary a sensing device in a first variation. A circuit 101 in FIG. 11 corresponds to the circuit 100 supplemented with a resistor R1. The resistor R1 is connected in series to the photodiode PD. Adding the resistor R1 lowers the voltage between the terminals of the photodiode PD upon reaction with a photon and thereby limits the current flowing through the photodiode PD. The resistance value of the resistor R1 is set to be such that quenching is possible when the parasitic capacitance of the cathode of the photodiode PD is discharged. In the circuit 101, the voltage amplitude starting from the time of reaction with a photon to execution of quenching is reduced. As a result, the power consumption of the circuit can be reduced. The remaining configuration of the circuit 101 is similar to that of the circuit 100. Also, the basic workings of the circuit 101 are similar to those of the circuit 100.

Figure 12:
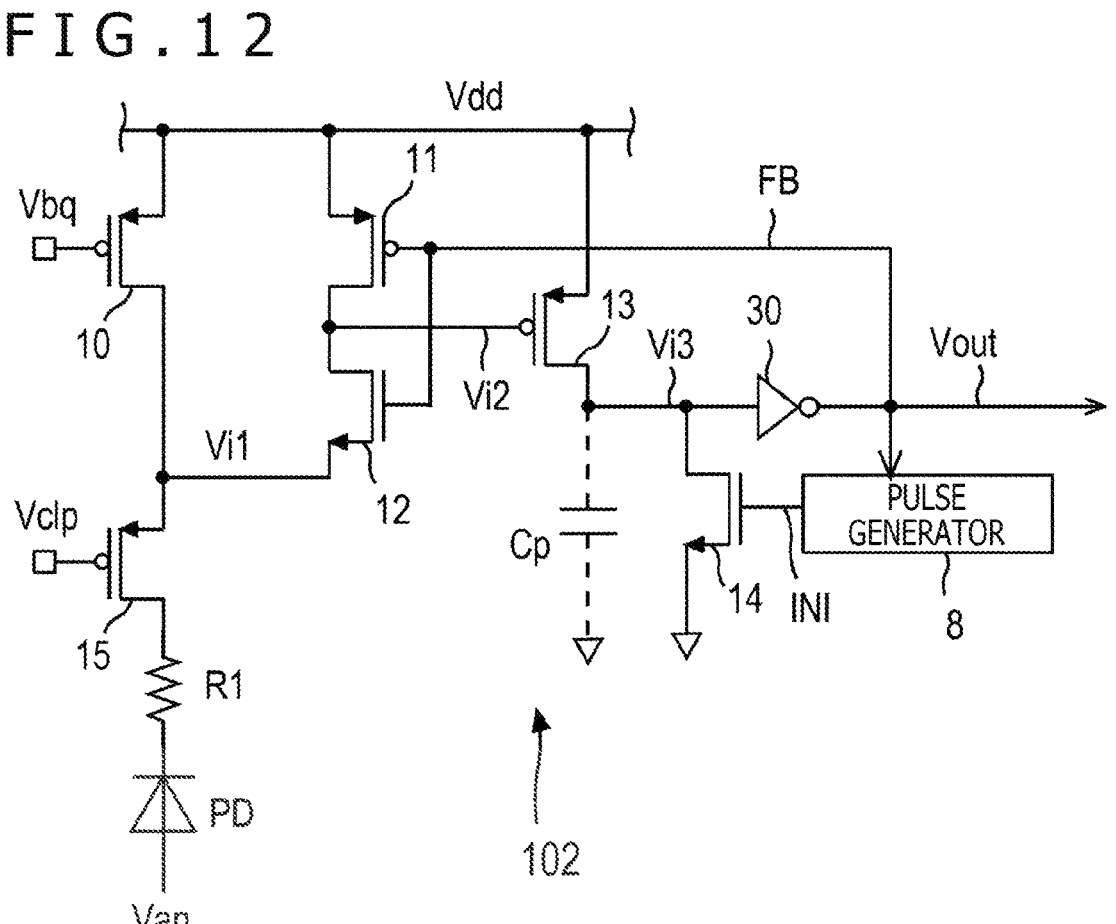
FIG. 12 is a circuit diagram depicting an exemplary sensing device in a second variation.

The circuit diagram of FIG. 12 depicts an exemplary sensing device in a second variation. A circuit 102 in FIG. 12 corresponds to the circuit 100 supplemented with a resistor R1 and a transistor 15. The resistor R1 and the transistor 15 are connected is series to the photodiode PD. The transistor 15 is a P-MOS transistor. Such a negative voltage Vclp as to make a voltage Vgs between the gate and the source of the transistor 15 equal to or higher than a threshold value is applied to the gate of the transistor 15. Before a photon enters the photodiode PD, the state between the source and the drain of the transistor 15 remains on. However, when the photodiode PD reacts with a photon and the voltage of the signal line Vi1 drops, the voltage Vgs between the gate and the source of the transistor 15 is lowered. As a result, the resistance value between the source and the drain of the transistor 15 increases. Hence, this makes it possible to limit the voltage amplitude on the signal line Vi and reduce the power consumption. It is to be noted that, although not depicted, the circuit 102 may be configured to be devoid of the resistor R1. The remaining configuration of the circuit 102 is similar to that of the circuit 100. Also, the basic workings of the circuit 102 are similar to those of the circuit 100.

That is, the sensing device according to the present disclosure may further include the first resistor connected interposingly between the load element and the photodetector, and the fourth transistor of the first conductivity type connected in series to the first resistor. The resistor R1 in FIG. 12 is an example of the first resistor. Also, the transistor 15 is an example of the fourth transistor.

Figure 13:
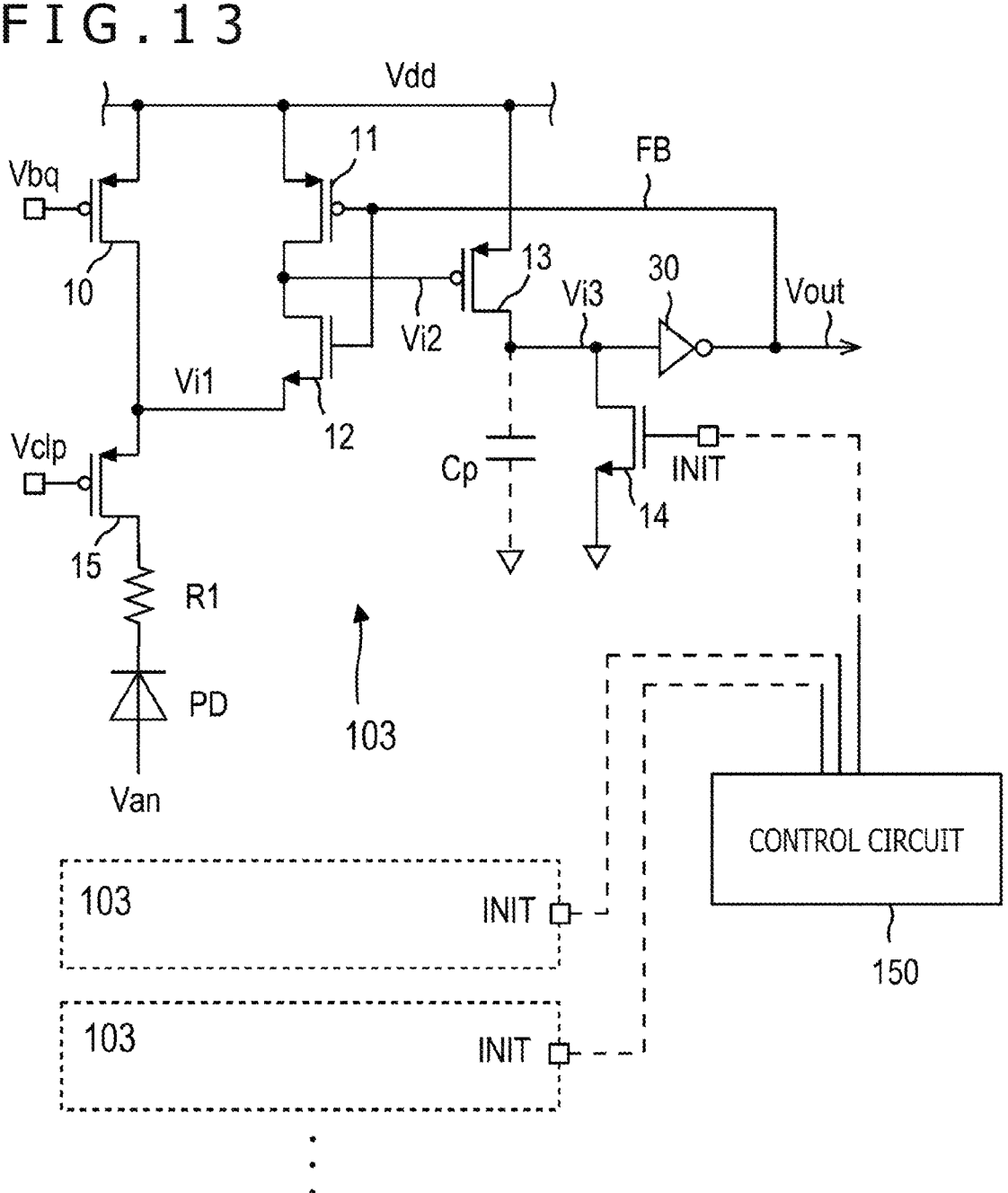
FIG. 13 is a circuit diagram depicting an exemplary sensing device in a third variation.

The circuit diagram of FIG. 13 depicts an exemplary sensing device in a third variation. A circuit 103 in FIG. 13 corresponds to the circuit 102 with the pulse generator 8 omitted. A signal line INIT in the circuit 103 is connected to an external control circuit. 150, for example. The external control circuit 150 generates reset pulses in place of the pulse generator 8. In a case where the configuration of the circuit 103 is adopted, there is no need to prepare a pulse generator for each pixel (i.e., photodiode). Multiple pixels are thus allowed to share the control circuit 150. It is not necessary for the control circuit 150 to supply a pulse to every one of the pixels connected therewith. In a case where at least any one of the pixels (i.e., one sensing device) connected to the measuring circuit 7 detects a photon, the control circuit 150 outputs a pulse onto the signal line INIT of the photon-detecting pixel. When the control circuit 150 is shared by multiple pixels (i.e., when the initializing section is shared by multiple detecting sections), the entire circuit size can be reduced. For example, compared with the circuit 102, the circuit 103 reduces by three-fourths the area of the circuit block that generates pulses. The remaining configuration of the circuit 103 is similar to that of the circuit 102. The workings of the circuit 103 are similar to those of the above-described circuit 100, except that the control circuit 150 generates reset pulses.

The circuit diagram of FIG. 14 depicts an exemplary sensing device in a fourth variation. A circuit 104 in FIG. 14 corresponds to the circuit 102 supplemented with a transistor 16. The source of the transistor 16 is connected to the power supply potential Vdd. On the other hand, the drain of the transistor 16 is connected to the source of the transistor 13. The transistor 16 is a P-MOS transistor. In the circuit 102, for example, when a timing at which the pulse generator 8 or an external control circuit inputs a reset pulse to the signal line INI coincides with a timing at which the voltage of the signal line Vi2 becomes LOW, there is a possibility that a flow-through current may occur between the power supply potential Vdd and the ground potential. In the circuit 104, a voltage Vbp2 applied to the gate of the transistor 16 can be controlled so as to prevent occurrence of the flow-through current. This can reduce the power consumption of the circuit. The remaining configuration of the circuit 104 is similar to that of the circuit 102. Also, the basic workings of the circuit 104 are similar to those of the above-described circuit 100.

The sensing device according to the present disclosure may further include an eleventh transistor that turns on the state between the first reference potential and the ninth transistor, according to the voltage applied to a first control electrode. The transistor 13 in FIG. 14 is an example of the ninth transistor. The transistor 16 in FIG. 14 is an example of the eleventh transistor. The gate of the transistor 16 is an example of the first control electrode.

Figure 15:
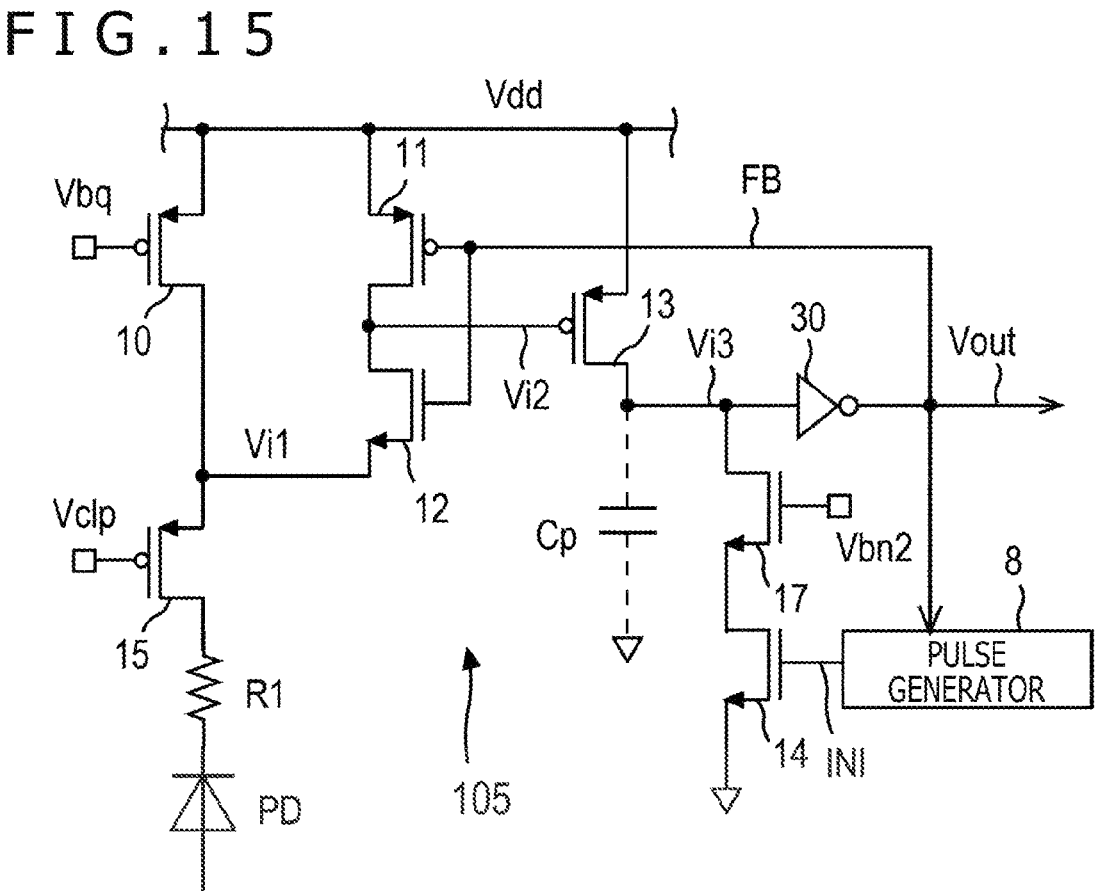
FIG. 15 is a circuit diagram depicting an exemplary sensing device in a fifth variation.

The circuit diagram of FIG. 15 depicts an exemplary sensing device in a fifth variation. A circuit 105 in FIG. 15 corresponds to the circuit 102 supplemented with a transistor 17. The drain of the transistor 17 is connected to the signal line Vi3. On the other hand, the source of the transistor 17 is connected to the drain of the transistor 14. The transistor 17 is an N-MOS transistor. In the circuit 105, a voltage Vbn2 applied to the gate of the transistor 17 can be controlled so as to prevent occurrence of a flow-through current and to reduce the power consumption of the circuit. The remaining configuration of the circuit 105 is similar to that of the circuit 102. Also, the basic workings of the circuit 105 are similar to those of the above-described circuit 100.

The sensing device according to the present disclosure may further include a twelfth transistor that turns on the state between the seventh signal line and the tenth transistor, according to the voltage applied to a second control electrode. The signal line Vi3 in FIG. 15 is an example of the seventh signal line. The transistor 14 in FIG. 15 is an example of the tenth transistor. The transistor 17 in FIG. 15 is an example of the twelfth transistor. The gate of the transistor 17 is an example of the second control electrode.

A specific configuration of the pulse generator 8 is explained below.

The circuit diagram of FIG. 16 depicts a first example of the pulse generator. A pulse generator 8A in FIG. 16 includes delay devices D1 and D2, an inverter 31, and an AND circuit P1. The delay devices D1 and D2 and the AND circuit P1 are connected in series between the signal line Tout and the signal line INT. A signal line Vd1 connects the delay device D1 with the delay device D2. Also, a signal line Vd2 connects the delay device D2 with one input terminal of the AND circuit P1. The inverter 31 connects the signal line Vd1 with the other input terminal of the AND circuit P1.

FIG. 17 depicts exemplary circuit voltage waveforms in a case where the pulse generator 8A is used. A signal delayed by the delay devices D1 and D2 is input to one input terminal of the AND circuit P1 from the signal line Vd2. On the other hand, a signal delayed by the delay device D1 and inverted by the inverter 31 is input to the other input terminal of the AND circuit P1. The AND circuit P1 outputs onto the signal line INI a signal corresponding to the logical product (AND) of the signals input from the two input terminals. Referencing the voltage waveforms in FIG. 17 reveals that given a LOW-level pulse on the signal line Vout, a HIGH-level pulse with a predetermined width is output from the signal line INI, following a time delay.

Figure 18:
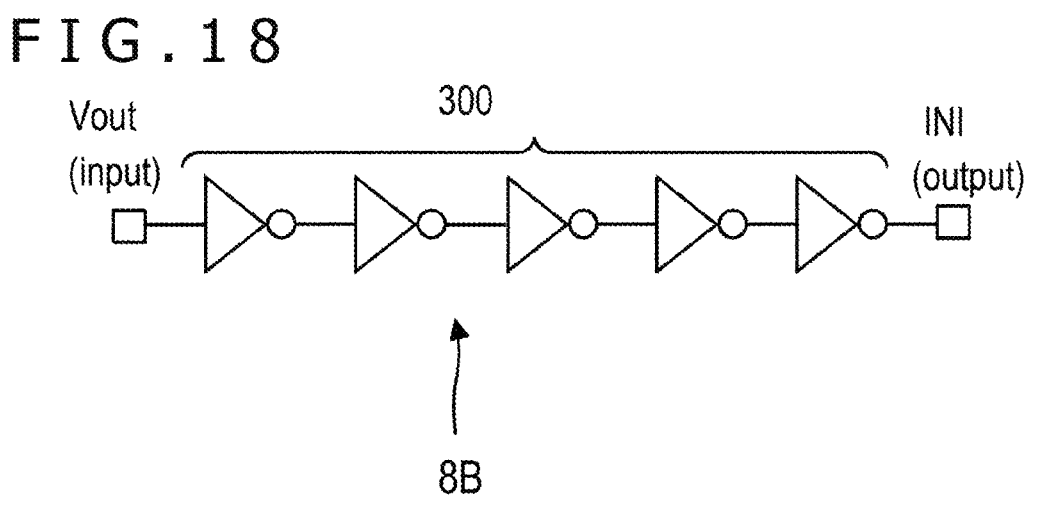

The circuit diagram of FIG. 18 depicts a second example of the pulse generator. A pulse generator 8B in FIG. 18 includes an inverter chain 300. In the inverter chain 300, five inverters are connected in series between the signal line Vout and the signal line INI. Alternatively, a different number of inverters may be included in the inverter chain. An even number of inverters may be provided according to the polarity of the reset pulse for use by the circuit. As another alternative, an odd number of inverters may be provided.

Figure 19:
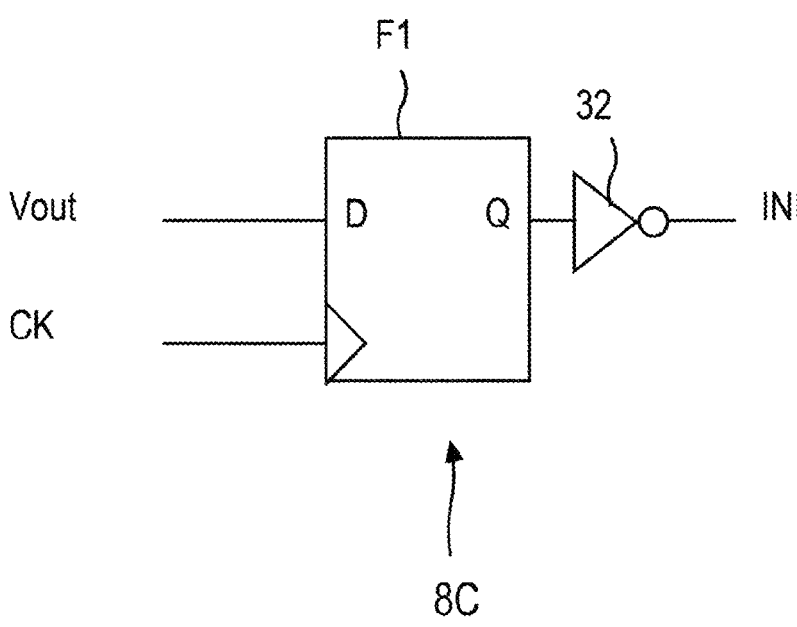
FIG. 19 is a circuit diagram depicting an exemplary pulse generator including a flip-flop.

The circuit diagram of FIG. 19 depicts a third example of the pulse generator. A pulse generator 8C in FIG. 19 includes a flip-flop F1 and an inverter 31. The flip-flop F1 is a D flip-flop. The signal line Vout is connected to a D terminal of the flip-flop F1. A signal line CK is connected to a clock terminal of the flip-flop F1. The inverter 32 is connected interposingly between a Q terminal of the flip-flop F1 and the signal line INI.

FIG. 20 depicts exemplary circuit voltage waveforms in a case where the pulse generator 8C is used. Referencing FIG. 20 reveals that the clock signal supplied to the signal line CK can be controlled so as to adjust the time delay from the time at which a LOW-level pulse is input from the signal line Vout to the time at which a HIGH-level signal is output onto the signal line INI. For example, prolonging the inter-pulse interval of the clock signal can increase the time delay. Also, shortening the inter-pulse interval of the clock signal can reduce the time delay. That is, using the pulse generator 8C makes it easy to control the time delay by means of an externally supplied clock signal.

The circuit diagram of FIG. 21 depicts a fourth example of the pulse generator. A pulse generator 8D in FIG. 21 includes transistors 40, 41, 42, and 43, an inverter 33, and a capacitor C1. The transistors 40 and 41 are P-MOS transistors. The transistors 42 and 43 are N-MOS transistors.

The connections between the elements of the pulse generator 8D are explained first. The sources of the transistors 40 and 41 are both connected to the power supply potential Vdd. The gates of the transistors 40 and 41 are both connected to a terminal Vbp. Also, the drain of the transistor 40 is connected to the drain of the transistor 41 via a signal line s1. The drain of the transistor 41 is connected to the drain of the transistor 43 via a signal line s2. The inverter 33 is connected interposingly between the signal line s1 and the signal line INI. That is, the output terminal of the pulse Generator 8D is connected to the signal line INI. The capacitor C1 is connected interposingly between the signal line s1 and the signal line s2. Further, the gate of the transistor 43 is connected to the signal line s1. A signal line Pout is connected to the gate of the transistor 42. That is, the input terminal of the pulse generator 8D is connected to the signal line Pout. For example, the signal line Pout is connected to the output terminal of the inverter 30. The sources of the transistors 42 and 43 are both connected to the ground potential.

The workings of the pulse generator 8D are explained next. The transistors 40 and 41 operate as current sources under control of the voltage applied to the terminal Vbp. Accordingly, the current sources allow currents to flow through the signal lines s1 and s2, charging the capacitor C1 corresponding to a feedback capacitance. The transistors 42 and 43 constitute a source-grounded two-stage amplification circuit. If the amplification factor of the two-stage amplification circuit is A, the result is equivalent to (1+A) times the electrostatic capacitance of the capacitor C1 due to a mirror effect. As a result, a large time delay can be obtained even if a capacitor with a small electrostatic capacitance is used as the capacitor C1. Using the pulse generator 8D can reduce the area in which the capacitor C1 is mounted. Also, by controlling the voltage applied to the terminal Vbq, it is possible to adjust the time at which delay from the time a LOW-level pulse is input from the signal line Pout to the time at which a HIGH signal is output onto the signal line INI. For example, the above-described control circuit 150 can control the voltage applied to the terminal Vbp.

The sensing device according to the present disclosure may have an output stage integrated with the Pulse generator. In the circuit in FIG. 22, to be discussed below, the pulse generator is integrated with the output stage of the sensing device.

Figure 22:
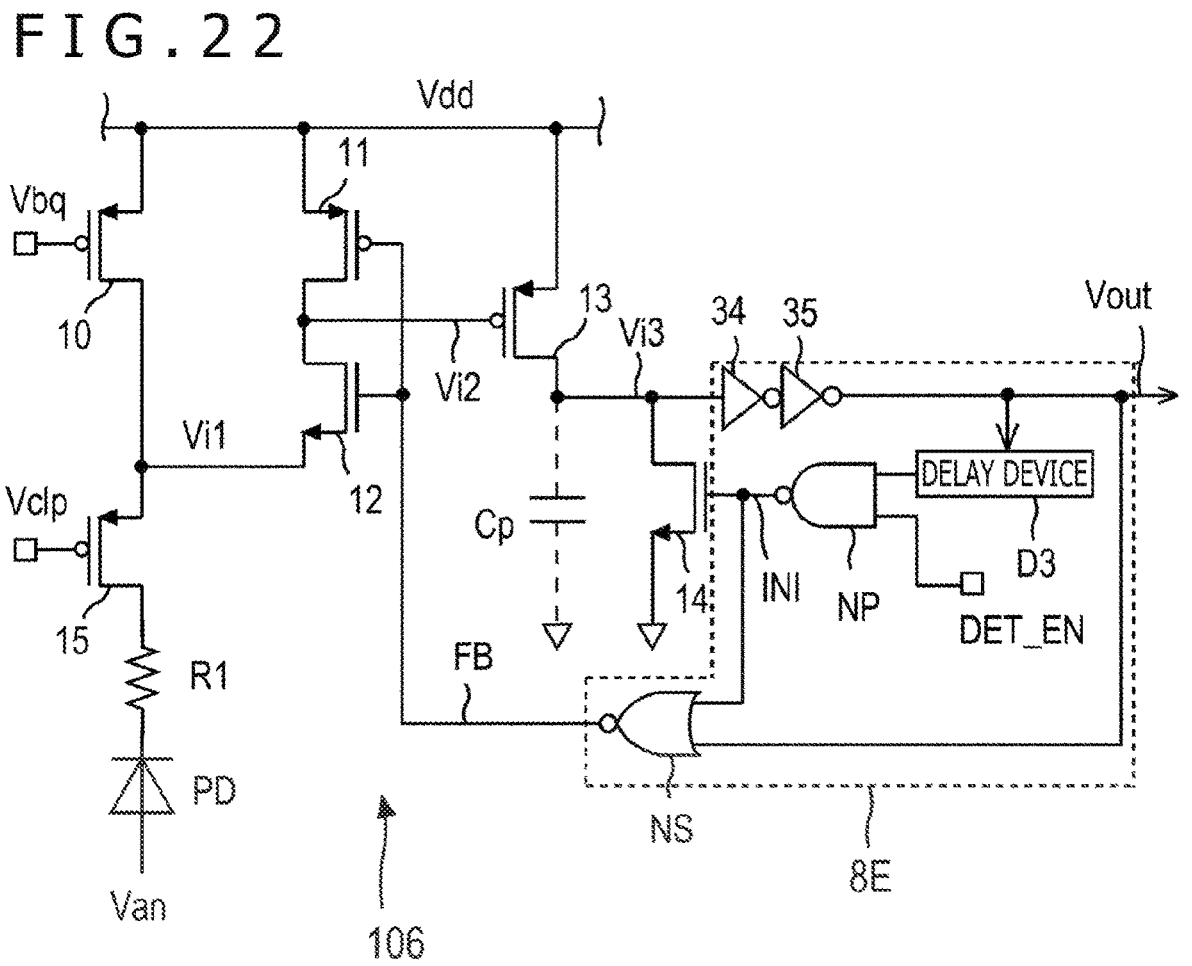
FIG. 22 is a circuit diagram depicting an exemplary sensing device in a sixth variation.

FIG. 22 depicts an exemplary sensing device in a sixth variation. Compared with the circuit 102 in FIG. 12, a circuit 106 in FIG. 22 is configured differently between the signal line Vi3 and the signal line Vout. Explained hereunder is the circuit 106 with emphasis on the differences from the above-described circuit 102.

In the circuit 106, a pulse generator 8E is connected interposingly between the signal line Vi3 and the signal line Vout. The pulse generator 8E includes inverters 34 and 35, a delay device D3, a NAND circuit NP, and a NOR circuit NS. The inverters 34 and 35 are connected in series between the signal line Vi3 and the signal line Pout. Also, the delay device D3 is connected interposingly between the signal line Vout and one input terminal of the NAND circuit NP. A terminal DET_EN is connected to the other input terminal of the NAND circuit NP. The output terminal of the NAND circuit NP is connected to the gate of the transistor 14 and to one input terminal of the NOR circuit NS. It is to be noted that the other input terminal of the NOR circuit NS is connected to the signal line Vout. The output terminal of the NOR circuit NS is connected to the gates of the transistors 11 and 12 via the signal line FB.

The workings of the circuit 106 are explained next. It is to be noted that the graphs in FIG. 23 depict exemplary voltage waveforms with the circuit 106. The graphs in FIG. 23 illustrate exemplary voltage waveforms on the signal lines Vi1, Vi2, Vi3, and Vout, on the terminal DET_EN, and on the signal line INI.

When the photodiode PD reacts with a photon, the current between the cathode and the anode increases, thereby lowering the voltage of the signal line Vi1. This causes the voltage of the signal line Vi2 connected with the signal line Vi1 via the transistor 12 to change from HIGH to LOW. When the LOW voltage is applied to the gate of the transistor 13, the state between the source and the drain or the transistor 13 is turned on. As a result, the voltage of the signal line Vi3 is brought HIGH by the power supply potential Vdd. The inverter 35 then outputs the HIGH signal onto the signal line Vout. This allows the circuit 106, upon detection of a photon, to output a HIGH-level (positive polarity) pulse from the signal line Vout to the downstream measuring circuit 7 as depicted in FIG. 23. It is to be noted that the present disclosure is not imitative of the polarity of the pulse output from the sensing device of this disclosure to the downstream measuring circuit.

The HIGH signal is input to one input terminal of the NOR circuit NS from the signal line Vout. In turn, the NOR circuit NS outputs the LOW voltage to bring the voltage of the signal line FB LOW. As a result, the LOW voltage is applied to the gates of the transistors 11 and 12. The state between the source and the drain of the transistor 11 turned on. On the other hand, the state between the drain and the source of the transistor 12 is turned off. The signal line Vi2 is electrically disconnected from the signal line Vi1, with the voltage brought HIGH by the power supply potential Vdd.

When the voltage of the signal line Vout becomes HIGH, the voltage of one input terminal of the NAND circuit NP also becomes HIGH, following a delay. As a result, the NAND circuit NP outputs the HIGH voltage unless the HIGH voltage is applied to the terminal DET_EN. The HIGH voltage is applied to the gate of the transistor 14, turning on the state between the drain and the source. Consequently, the signal line Vi3 is reset by the ground potential to carry the LOW voltage. At this point, the inverter 35 outputs the LOW voltage onto the signal line Vout.

As a result, the voltage on one input terminal of the NOR circuit NS be, LOW. In addition, when the LOW voltage is applied to the terminal DET_EN, the voltage on the other input terminal of the NOR circuit NS also becomes LOW, following a delay. Because the two input terminals of the NOR circuit NS have the LOW voltage, the NOR circuit NS outputs the HIGH voltage. With the voltage of the signal line FB thus brought HIGH, the HIGH voltage is applied to the gates of the transistors 11 and 12. Hence, this turns off the state between the source and the drain of the transistor 11. Also, the state between the drain and the source of the transistor 12 is turned on. Because electrical conduction is established between the signal line Vi1 and the signal line Vi2, it is now possible to detect a photon.

In the circuit 106, when a signal twice passes through a loop formed by the inverters 34 and 35, delay device D3, NAND circuit NP, and transistor 14, a circuit reset operation is completed, following the detection of a photon. That is, the delay device D3 as a single delay device provides a time delay corresponding to two delay devices. Mounting the pulse generator 8E of the circuit 106 eliminates the need for using multiple delay devices as in the case of the pulse generator 8A in FIG. 16. This can reduce the circuit mounting area.

The sensing device according to the present disclosure may include a photodetector, a seventh transistor of the second conductivity type, an eighth transistor of the first conductivity type, a ninth transistor of the first conductivity type, a tenth transistor of the second conductivity type, a sixth inverter, a seventh inverter, a third delay device, a NOR circuit, and a NAND circuit. The photodetector is connected interposingly between the photodetector and the first reference potential. The seventh transistor turns on the state between the photodetector and the sixth signal line, according to the voltage of the fifth signal line. The eighth transistor turns on the state between the first reference potential and the seventh transistor, according to the voltage of the fifth signal line. The ninth transistor turns on the state between the first reference potential and the seventh signal line, according to the voltage of the sixth signal line. The tenth transistor turns on the state between the seventh signal line and the second reference potential, according to the voltage of the eighth signal line. The sixth inverter is connected to the seventh signal line. The seventh inverter is connected interposingly between the sixth inverter and the ninth signal line. The third delay device is connected to the ninth signal line. The NOR circuit is configured in such a manner that the result of a NOR operation on the output voltage from the third delay device and on the voltage of the tenth signal line is output onto the eighth signal line. The NAND circuit is configured in such a manner that the result of a NAND operation on the voltage of the ninth signal line and on the voltage of the eighth signal line is output onto the fifth signal line.

For example, a P-MOS transistor can be used as a transistor of the first conductivity type, and an N-MOS transistor can be used as a transistor of the second conductivity type. In this case, the power supply potential can be used as the first reference potential, and the ground potential can be used as the second reference potential. Alternatively, an N-MOS transistor can be used as a transistor of the first conductivity type, and a P-MOS transistor can also be used as a transistor of the second conductivity type. In this case, the ground potential can be used as the first reference potential, and the power supply potential can be used as the second reference potential.

The transistor 12 in FIG. 22 is an example of the seventh transistor. The signal line FB in FIG. 22 is an example of the fifth signal line. The signal line Vi8 in FIG. 22 is an example of the sixth signal line. The transistor 11 is an example of the eighth transistor. The transistor 13 is an example of the ninth transistor. The signal line Vi3 FIG. 22 is an example of the seventh signal line. The transistor 14 is an example of the tenth transistor. The signal line INI in FIG. 22 is an example of the eighth signal line. The inverter 34 is an example of the sixth inverter. The inverter 35 is an example of the seventh inverter. The signal line Vout in FIG. 28 is an example of the ninth signal line.

The circuit diagram of FIG. 24 depicts an exemplary sensing device in a seventh variation. A circuit 107 in FIG. 24 has a reduced number of transistors. The circuit 107 includes a photodiode PD, a resistor R1, transistors 10, 15, 21, 23, and 24, an inverter 36, and a pulse generator 8F. The pulse generator D3 has a delay device D3 and a NAND circuit NP as its constituent elements. The transistors 10, 15, 21, and 23 are P-MOS transistors. On the other hand, the transistor 24 is an N-MOS transistor. The transistor 10 corresponds to the load element of the photodiode PD. The transistor 10 may be replaced by a resistor as the load element.

The configuration of the circuit 107 is explained first. The sources of the transistors 10 and 21 are connected to the power supply potential Vdd. The drain of the transistor 10 is connected to the gate of the transistor 23 via the signal line Vi1. In addition, the drain of the transistor 10 is also connected to the source of the transistor 15. The resistor R1 is connected interposingly between the drain of the transistor 15 and the cathode of the photodiode PD. The voltage Van is applied to the anode of the photodiode PD. The value of the voltage Van can be determined in such a manner that a reverse voltage equal to or higher than the breakdown voltage is applied between the cathode and the anode (i.e., between the terminals) of the photodiode PD.

The source of the transistor 23 is connected to the drain of the transistor 21. On the other hand, the drain of the transistor 23 is connected to the inverter 36 via the signal line Vi3. In addition, the drain of the transistor 23 as also connected to the drain of the transistor 24. The source of the transistor 24 is connected to the ground potential. The gate of the transistor 24 is connected to the output terminal of the NAND circuit NP and to the gate of the transistor 21. The output terminal of the inverter 36 is connected to the signal line Vout. The delay device D3 is connected interposingly between the signal line out and one input terminal of the NAND circuit NP. The other input terminal of the NAND circuit NP is connected to a terminal xRST.

The workings of the circuit 107 are explained next. When the photodiode PD reacts with a photon, the current between the cathode and the anode increases, thereby lowering the voltage between the source and the drain of the transistor 10. This causes the voltage of the signal line Vi1 (i.e., signal line between the photodiode PD and the transistor 10) to become LOW. As a result, the LOW voltage is applied to the gate of the transistor 23, turning on the state between the source and the drain of the transistor 23. This in turn increases the current flowing between the source and the drain of the transistor 21. Consequently, the voltage between the gate and the source of the transistor 21 is raised by the Id-Vgs characteristics.

That is, approximately at the same time that the state between the source and the drain of the transistor 23 is turned on, the state between the gate and the source of the transistor 21 is turned on. Because both the transistor 21 and the transistor 23 are turned on, the voltage of the signal line Vi3 is brought HIGH by the power supply potential Vdd. Upon receiving input of the HIGH voltage, the inverter 36 outputs the LOW voltage onto the signal line Vout. In this manner, upon detection of a photon, the circuit 107 outputs a LOW-level (negative polarity) pulse from the signal line Vout to the downstream measuring circuit 7. It is to be noted that the present disclosure is not limitative of the polarity of the pulse output from the sensing device of this disclosure.

When the voltage of the signal line Vout becomes LOW, the voltage of one input terminal of the NAND circuit NP also becomes LOW, following a delay. The NAND circuit NP thus outputs the HIGH voltage onto the signal line INI. The HIGH voltage is applied to the gate of the transistor 24, thereby turning on the state between the drain and the source of the transistor 24. In addition, the state between the drain and the source of the transistor 21 is also turned off, inhibiting occurrence of a flow-through current from the power supply to the ground. The voltage of the signal line Vi3 (i.e., signal line between the transistors 23 and 34) is thus initialized to become LOW by the ground potential. When the voltage of the signal line Vi3 is brought LOW, the inverter 36 outputs the HIGH voltage onto the signal line Vout. This causes the circuit 108 to stop outputting a LOW-level pulse.

It is to be noted that the configuration of the pulse generator 8F in FIG. 24 is only an example. A differently configured pulse generator may be used alternatively. For example, the pulse generator 8F may be replaced by the pulse generator depicted in each of the above-described circuit diagrams (FIGS. 16, 18, 19, 21, and 22). As another alternative, the pulse generator 8F may be omitted, and the external control circuit 150 may be connected to the signal line INI. In this case, the external control circuit can generate a HIGH-level pulse in response to the output signal from one or multiple sensing devices. Note that, in the circuit 107, at least either the transistor 15 or the resistor R1 can be omitted.

Figure 25:
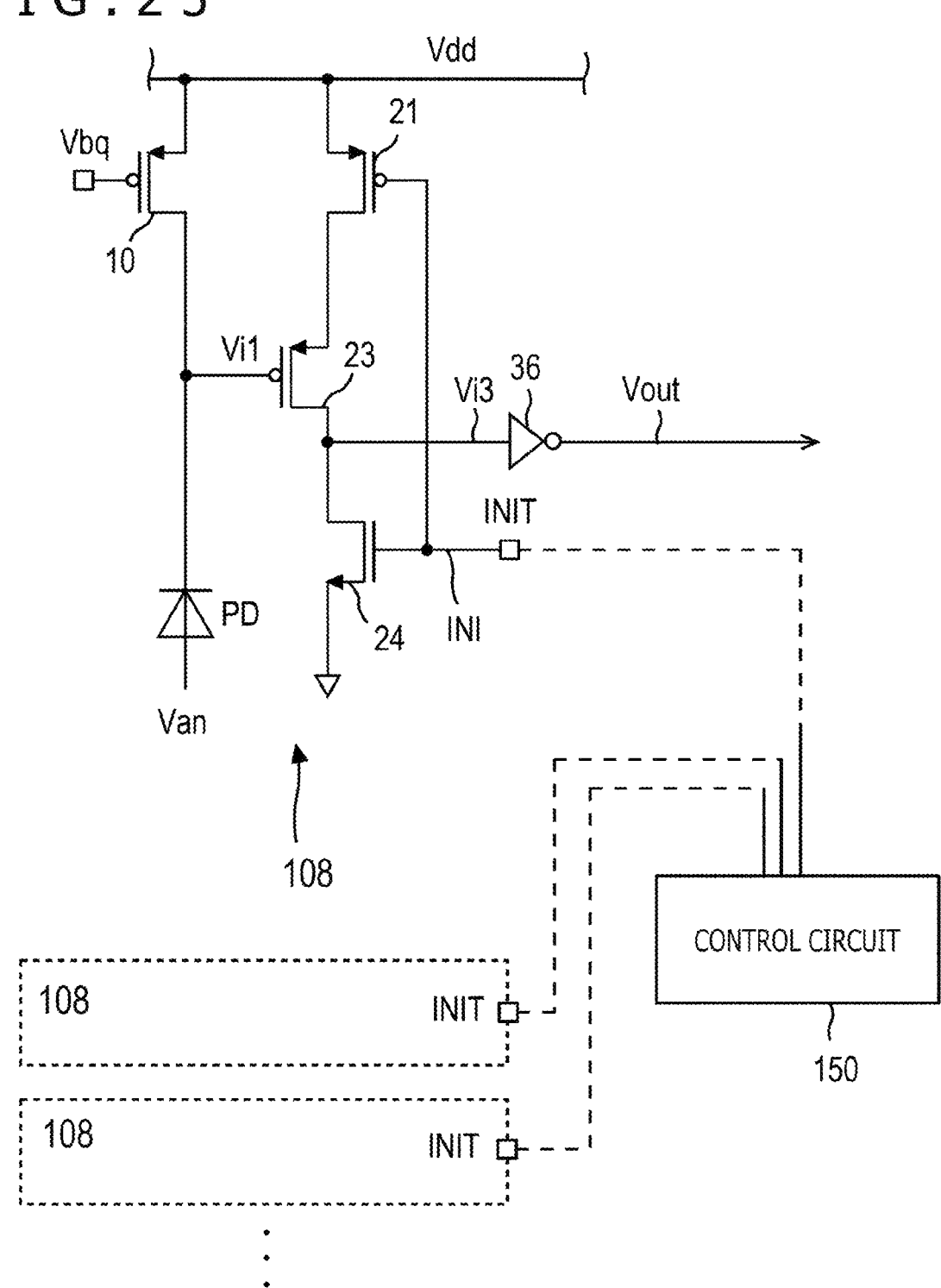
FIG. 25 is a circuit diagram depicting an exemplary sensing device in an eighth variation.

The circuit diagram of FIG. 25 depicts an exemplary sensing device in an eighth variation. A circuit 108 in FIG. 25 corresponds to the circuit 107 with the transistor 15, the resistor R1, and the pulse generator 8F omitted. The signal line INIT in the circuit 108 is connected to the external control circuit 150, for example. In place of the pulse generator 8, the external control circuit 150 generates the reset pulse. In a case where the configuration of the circuit 108 is adopted, there is no need for preparing a pulse generator for each pixel (photodiode), allowing multiple pixels to share the control circuit 150. It is not necessary for the control circuit 150 to supply pulses to every one of the connected pixels. For example, in a case where a photon is detected by at least any one of the pixels (sensing devices) connected to the measuring circuit 7, the control circuit 150 outputs a pulse onto the signal line INIT of the photon-detecting pixel. When multiple pixels share the control circuit 150 (i.e., when multiple detecting sections share the initializing section), the entire circuit size can be reduced. The remaining configuration of the circuit 108 is similar to that of the circuit 107. The basic workings of the circuit 108 are similar to those of the above-described circuit 107 except that the reset pulse is generated by the control circuit 150.

The sensing device according to the present disclosure may include a photodetector, a load element, a first transistor of the first conductivity type, a second transistor of the first conductivity type, a third transistor of the second conductivity type, and a first inverter. The load element is connected interposingly between the photodetector and the first reference potential. The first transistor is turned on according to the voltage of the first signal line between the photodetector and the load element. The second transistor turns on the state between the first reference potential and the first transistor according to either the current of the first transistor or the voltage of the second signal line. The third transistor turns on the state between the first transistor and the second reference potential according to the voltage of the second signal line. The first inverter is connected interposingly between the third signal line, which is between the first and the third transistors, and the fourth signal line.

For example, a P-MOS transistor can be used as a transistor of the first conductivity type, and an N-MOS transistor can be used as a transistor of the second conductivity type. In this case, the power supply potential can be used as the first reference voltage, and the ground potential can be used as the second reference potential. Alternatively, an N-MOS transistor can be used as a transistor of the first conductivity type, and a P-MOS transistor can also be used as a transistor of the second conductivity type. In this case, the ground potential can be used as the first reference potential, and the power supply potential can be used as the second reference potential.

The transistor 10 in FIGS. 24 and 25 is an example of the load element. It is to be noted that a passive component such as a resistor may be used as the load element. The transistor 23 is an example of the first transistor. The transistor 21 is an example of the second transistor. The transistor 24 is an example of the third transistor. The signal line INI in FIGS. 24 and 25 is an example of the second signal line. Also, the signal line Vi3 is an example of the third signal line. The signal line Vout is an example of the fourth signal line. For example, an avalanche photodiode can be used as the photodetector.

In addition, the sensing device according to the present disclosure may further include a pulse generator configured to output a pulse onto the second signal line, according to the voltage of the fourth signal line. The pulse generator may alternatively be configured to output a pulse onto the second signal line, following a time delay in response to a change in the voltage level on the fourth signal line. The sensing device may further include a first resistor connected interposingly between the load element and the photodetector, and a fourth transistor of the first conductivity type connected in series to the first resistor. The transistor 15 in FIG. 24 is an example of the fourth transistor. In addition, the resistor R1 is an example of the first resistor.

In addition, as in the example in FIG. 16, the pulse generator can include a first delay device, a second delay device connected in series to the first delay device, an AND circuit connected to the downstream side of the second delay device, and a third inverter connected interposingly between the first delay device and the AND circuit. The delay device D1 in FIG. 16 is an example of the first delay device. The delay device D2 an example of the second delay device. The inverter 31 is an example of the third inverter. In this case, the first delay device can be connected to the fourth signal line, and the downstream side of the AND circuit can be connected to the second signal line. Here, the signal line Vout in FIGS. 24 and 25 is an example of the fourth signal line. In addition, the signal line INI is an example of the second signal line. Further, as in the example in FIG. 18, the pulse generator may include an inverter chain.

Also, as in the example in FIG. 19, the pulse generator may include a flip-flop and a fourth inverter connected to the Q terminal of the flip-flop. In this case, the D terminal of the flip-flop can be connected to the fourth signal line, and the output side of the fourth inverter can be connected to the second signal line.

Further, as in the example in FIG. 21, the pulse generator may include a source-grounded two-stage amplification circuit, a first current source, a second current source, a capacitor, and a fifth inverter. Here, the first current source is connected to a first stage of the two-stage amplification circuit. The second current source is connected to a second stage of the two-stage amplification circuit. The capacitor provides connection between the first stage and the second stage of the two-stage amplification circuit. The fifth inverter is connected to the first stage of the two-stage amplification circuit. The transistors 42 and 43 in FIG. 21 constitute an example of the source-grounded two-stage amplification circuit. The transistor 40 is an example of the first current source. The transistor 41 is an example of the second current source. In this case, the input terminal of the two-stage amplification circuit can be connected to the fourth signal line, and the output terminal of the fifth inverter can be connected to the second signal line.

Figure 26:
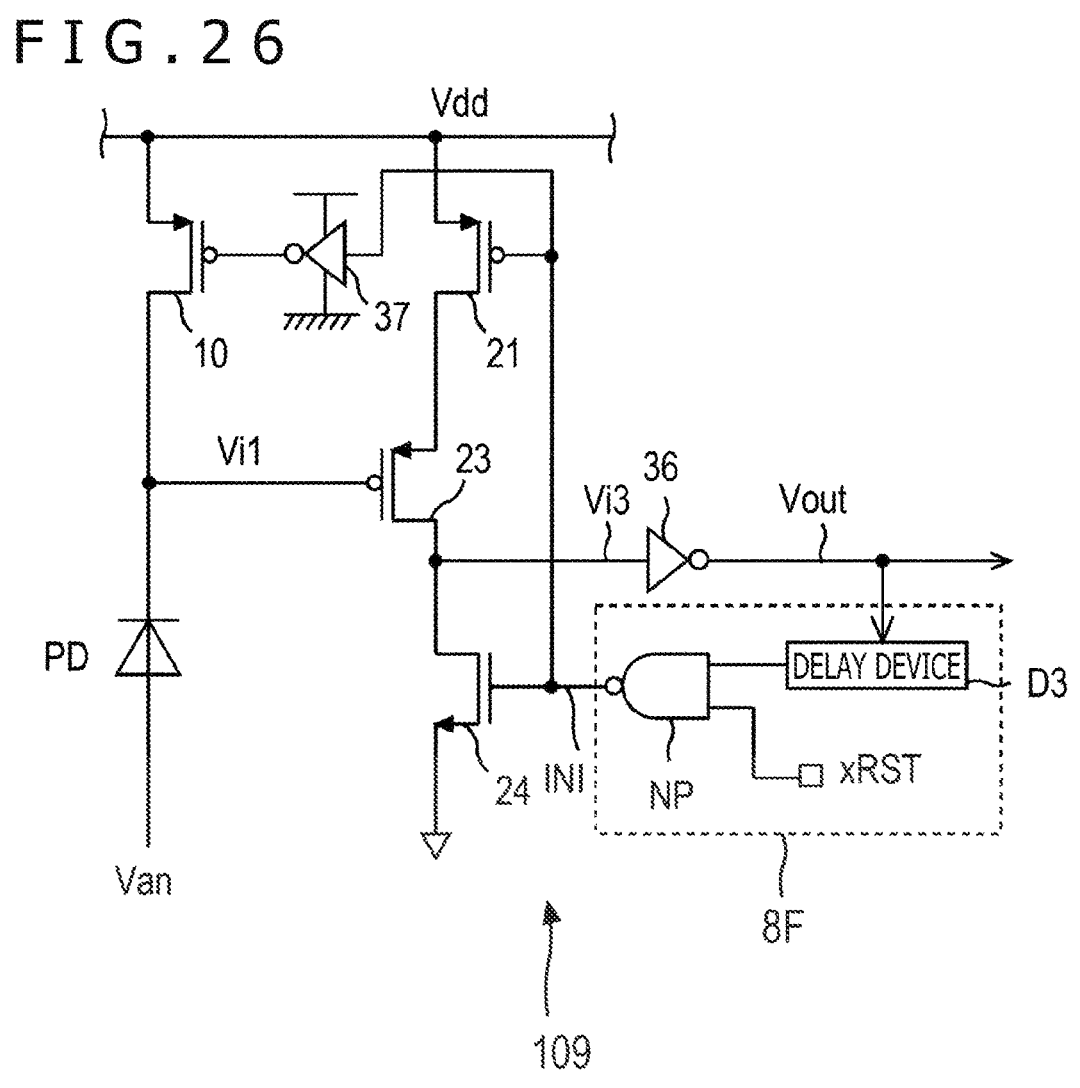

The circuit diagram of FIG. 26 depicts an exemplary sensing device in a ninth variation. A circuit 109 in FIG. 26 corresponds to the circuit 107 devoid of the transistor 15 and resister R1 and supplemented with an inverter 37. The input terminal of the inverter 37 is connected to the output terminal of the NAND circuit NP via the signal line INI. In addition, the gate of the transistor 10 is connected to the output terminal of the inverter 37 in place of to the terminal Vbq. The remaining configuration of the circuit 109 is similar to that of the circuit 107.

In the circuit 109, as in the circuit 107, the photodiode PD reacts with a photon to bring about a state in which the voltage of the signal line Vi1 is LOW, the voltage of the signal line Vi3 is HIGH, and the voltage of the signal line Vout is LOW (a LOW-level pulse is output onto the signal line Vout). At this point, the NAND circuit NP outputs the HIGH voltage onto the signal line INI. In this case, the inverter 37 applies the LOW voltage to the gate of the transistor 10 so as to output the LOW voltage. This turns on the state between the source and the drain of the transistor 10. As a result, the potential of the signal line Vi1 and that of the cathode of the photodiode PD are brought HIGH by the power supply potential Vdd. This brings the inter-terminal voltage of the photodiode PD down to the breakdown voltage and thereby stops the avalanche phenomenon (i.e., quenches the photodiode PD).

In addition, when the voltage of the signal line INI is HIGH, the HIGH voltage is applied to the gates of the transistors 21 and 24. This turns off the state between the drain and the source of the transistor 21, and turns on the state between the drain and the source of the transistor 24. As a result, the voltage of the signal line Vi3 is initialized to become LOW by the ground potential. With the voltage of the signal line Vi3 brought LOW, the inverter 36 outputs the HIGH voltage onto the signal line out. This causes the voltage of one input terminal of the NAND circuit NP to become HIGH, following a delay by the delay device D3. Further, when the HIGH voltage is applied to the terminal xRST, the NAND circuit NP outputs the LOW voltage onto the signal line INI. At this point, the HIGH voltage, following inversion by the inverter 37 is applied to the gate of the transistor 10. Because the state between the source and the drain of the transistor 10 is turned off, the signal line Vi1 is electrically disconnected from the power supply potential Vdd. Since the inter-terminal voltage of the photodiode PD becomes equal to or higher than the breakdown voltage, the circuit 100 is again ready to detect a photon.

As with the circuit 109, pulse-driven active quenching may be performed by use of the transistor 10. The circuit 109 permits high-speed quenching in a short period. In addition, because a resistor or a current source transistor is not connected in series to the photodiode PD in the circuit 109, the photodiode PD can respond at high speed. Alternatively, as with the above-described circuit 107, passive quenching may be carried out by use of the transistor 10 as the current source. Also, it is possible to use an output quenching circuit or a High-Z quenching circuit in combination. The sensing device according to the present disclosure may adopt any type of quenching method. As another alternative, the circuit may be configured in such a manner that the HIGH and LOW voltage levels output from the inverter 37 can be adjusted according to the characteristics of the photodiode PD. For example, the HIGH voltage level can be set to Vbq, and the LOW voltage level can be set to 0 V.

The sensing device according to the present disclosure may further include a second inverter connected to the second signal line. In this case, the load element is the fifth transistor of the first conductivity type, the fifth transistor being turned on according to the output voltage from the second inverter. The signal line INI in FIG. 26 is an example of the second signal line. The inverter 37 is an example of the second inverter. The transistor 10 is an example of the fifth transistor.

The circuit diagram of FIG. 27 depicts an exemplary sensing device in a tenth variation. A circuit 110 in FIG. 27 corresponds to the circuit 109 supplemented with a transistor 25. It is to be noted that, for the purpose of simplification, the inverter 37 is omitted in FIG. 27. The transistor 25 is an N-MOS transistor. The gate of the transistor 10 is connected to the output terminal of the NAND circuit NP via the signal line INI. The gate of the transistor 25 is also connected to the output terminal of the NAND circuit NP via the signal line INI. In addition, the drain of the transistor 25 is connected to the signal line Vi1. The source of the transistor 25 is connected to the ground potential. The remaining configuration of the circuit 110 is similar to that of the circuit 109.

In the circuit 110, as in the circuits 107 and 109, the photodiode PD reacts with a photon to bring about a state in which the voltage of the signal line Vi1 is LOW, the voltage of the signal line Vi3 is HIGH, and the voltage of the signal line Vout is LOW (a LOW-level pulse is output onto the signal line Vout). At this point, the NAND circuit NP outputs the HIGH voltage onto the signal line INI. As a result, the HIGH voltage is applied to the gate of the transistor 25, thereby turning on the state between the drain and the source of the transistor 25. Consequently, the cathode of the photodiode PD is connected to the ground potential, which stops the avalanche phenomenon. As described above, the circuit 110 is a circuit that performs active quenching.

Also, in the circuit 110, conduction occurs between the drain and the source of the transistor 24, causing the voltage of the signal line Vi3 to become LOW and the voltage of the signal line Vout to become HIGH. In a case where the HIGH voltage is applied to the terminal xRST, the voltage of one input terminal of the NAND circuit NP goes HIGH, following a delay by the delay device D3, causing the NAND circuit NP to output the LOW voltage onto the signal line INI. Because the LOW voltage is applied to the gate of the transistor 10, the state between the source and the drain of the transistor 10 is turned on. As a result, the potential of the cathode of the photodiode PD is raised by the power supply potential Vdd. In addition, because the inter-terminal voltage of the photodiode PD becomes equal to or higher than the breakdown voltage, the circuit 110 is again ready to detect a photon.

In the circuit 110, when the signal corresponding to a photon is output from the signal line Vout, the cathode of the photodiode PD is connected to the ground potential. This permits high-speed quenching. Because the transistor 10 is also driven by a pulse, the cathode voltage of the photodiode PD is also raised more quickly than if a current-source transistor is used.

The sensing device according to the present disclosure may further include a sixth transistor of the second conductivity type that turns on the state between the second reference potential and the second signal line according to the voltage of the second signal line. In this case, the load element is the fifth transistor of the first conductivity type that is turned on according to the voltage of the second signal line. The signal line INT in FIG. 27 is an example of the second signal line. The ground potential is an example of the second reference potential. The transistor 25 is an example of the sixth transistor. In addition, the transistor 10 is an example of the fifth transistor.

The perspective diagram of FIG. 26 depicts an example of how to mount sensing devices by use of Cu—Cu connections. FIG. 28 illustrate substrates 51 and 52, which are silicon substrates, for example. It is to be noted that the material of the substrates 51 and 52 are not restricted. Multiple pixels 510 are formed on the substrate 51. In each of the pixels 510 is a photodiode PD (e.g., SPAD). The surface of the photodiode PD in the pixel 510 is at least partially open, so that the photodiode PD can react with an incident photon. On the substrate 52, a circuit block 520 is formed corresponding to each of the pixels 510. The circuit block 520 includes, for example, a circuit corresponding to the detecting section 9 or 9A in FIG. 1 (e.g., the circuits 100 through 110 discussed above). The pixels 510 on the substrate 51 and the circuit blocks 520 on the substrate 52 are electrically connected with each other by a Cu—Cu connection (copper to copper connection). Adopting the Cu—Cu connection makes it possible to make the sensing device smaller in size and to reduce its production cost.

In the pixel 510, the photodiode PD alone may be formed. This can maximize the area of the photodiode PD. Alternatively, besides the photodiode PD, other elements may be formed in the pixel 510. For example, the resistor R1 or the transistor 15 may be formed in the pixel 510. In this case, it is possible to reduce the area of the circuit block 520 or increase the functions implemented by the circuit block 520. In addition, because the signal amplitude on the Cu—Cu connections limited, power consumption can be reduced. Depending on the required use, it is possible to adjust allocation of the elements to the pixel 510 and to the circuit block 520. It is to be noted that, whereas FIG. 28 indicates that the sensing devices are mounted by use of Cu—Cu connections, this method of mounting is only an example. As another example, the sensing devices may be mounted by use of through-silicon vias (TSV) or the like. That is, there are no restrictions on the method of mounting for the sensing devices. Although the example in FIG. 28 has a two-layer substrate structure, there are no restrictions on the number of the substrates configured.

In the sensing device according to the present disclosure, a first substrate on which the photodetectors are mounted may be electrically connected by Cu—Cu connections with a second substrate on which other elements are mounted.

The circuit diagram of FIG. 29 depicts an exemplary circuit supporting dToF-based distance measurement. In FIG. 29, multiple circuits 109 are connected via a circuit TR1 to the downstream measuring circuit 7. The circuit TR1 performs the OR operation on the output signals from the multiple circuits 109 (i.e., voltage signals from the signal lines Vout). This allows the measuring circuit 7 to count the number of output pulses. On the basis of the time correlation between the pulses, the measuring circuit 7 can determine whether or not the reflected light r1 of the light em emitted from the light source 91 is detected. In a case where the reflected light r1 is determined to be detected, the distance from the sensing device to the object 80 can be calculated on the basis of the time of flight as discussed above.

FIG. 30 schematically depicts an exemplary circuit that includes a counter and a TDC. FIG. 30 indicates an example of the above-described measuring circuit 7. A circuit 200 in FIG. 30 includes a circuit block 54, multiple buffers 55, a circuit TR2, an AND circuit P2, a trigger circuit 56, a logic circuit 93, a flip-flop F2, and multiple flip-flops 57. The circuit block 54 corresponds to multiple sensing devices (e.g., circuits 100 through 110 discussed above). The multiple buffers 55 digitize signals output from the individual sensing devices. The circuit 192 is a circuit in which OR circuits are connected in a tree structure, the circuit TR2 performing the OR operation on the signals output from the multiple buffers 55. The AND circuit 92 performs an AND operation on the signal input from a signal line CTR1 and on the output signal from the circuit TR2, and inputs the result of the AND operation to the trigger circuit 56. Alternatively, the circuit TR2 may be a circuit that performs not the OR operation but an EXOR operation. This makes it possible to count simultaneously detected photons at two timings, i.e., at a failing edge and a rising edge of the signal waveform.

The trigger circuit 56 is configured such that, upon detecting pulses having a time correlation therebetween equal to or larger than a threshold value within a predetermined period, the trigger circuit 56 outputs a trigger signal to a TDC 58. It is to be noted that digital control signals are supplied to the signal line CTR1, to a signal line CTR2, and to a signal line CTR1. The TDC 58 supplies information regarding a measured time difference TDC_cnt to a downstream circuit. The multiple flip-flops 57 are connected with each other. These flip-flops 57 supply the downstream circuit with the number of photons "count" detected within a predetermined time period. It is to be noted that the circuit 200 is only an example of the measuring circuit. A differently configured measuring circuit may be connected to the sensing device.

As illustrated in FIGS. 1, 2, 13, 25, 29, and 30, the distance measuring apparatus according to the present disclosure may include a light source, multiple sensing devices, a logic circuit, and a measuring circuit. The logic circuit is configured to output the result of the OR operation on the output voltages from the multiple sensing devices. The measuring circuit is configured to measure the distance to an object, on the basis of a timing at which light is emitted from the light source and of the signal output from the logic circuit. Here, the circuit TR1 in FIG. 29 and the circuit TR2 in FIG. 30 are each an example of the logic circuit. In the measuring circuit 7 and in the circuit 200 in FIG. 20, the components downstream of the circuit TR2 constitute an example of the measuring circuit.

Further, as depicted in FIG. 25, the distance measuring apparatus according to the present disclosure may include a control circuit connected to the second signal lines of multiple sensing devices. The control circuit is configured to output a pulse onto the second signal lines on the basis of the signal input to the measuring circuit from the fourth signal line of at least any one of the sensing devices.

In the sensing device and the distance measuring apparatus according to the present disclosure, every time a pulse is generated, following reaction of the photodiode PD with a photon, the voltages in the circuit are reset. This makes possible to detect the next photon in a short period of time. As a result, using the sensing device and the distance measuring apparatus according to the present disclosure permits detection of photons with monotonically increasing characteristics even in a high-illuminance environment. The sensing device and the distance measuring apparatus according to the present disclosure support a wide dynamic range of brightness. This makes it possible to measure the distance to an object with high accuracy, regardless of the illuminance environment. Furthermore, the sensing device and the distance measuring apparatus according to the present disclosure make it possible to output pulses of a constant width to the downstream circuit, regardless of the length of the recharging time. It is also possible to adopt a configuration that permits adjustment of the time delay with which the reset pulse is generated as well as adjustment of the width of the pulse output to the downstream circuit. In this case, the pulse output timing and the pulse width can be adjusted in keeping with the measuring circuit in use.

The technology according to the present disclosure (the present technology) can be applied to diverse products. For example, the technology of this disclosure may be implemented as an apparatus to be mounted on a mobile body such as any type of automobiles, electric vehicles, hybrid electric vehicles, motorcycles, bicycles, personal mobility devices, aircraft, drones, ships, and robots.

Figure 31:
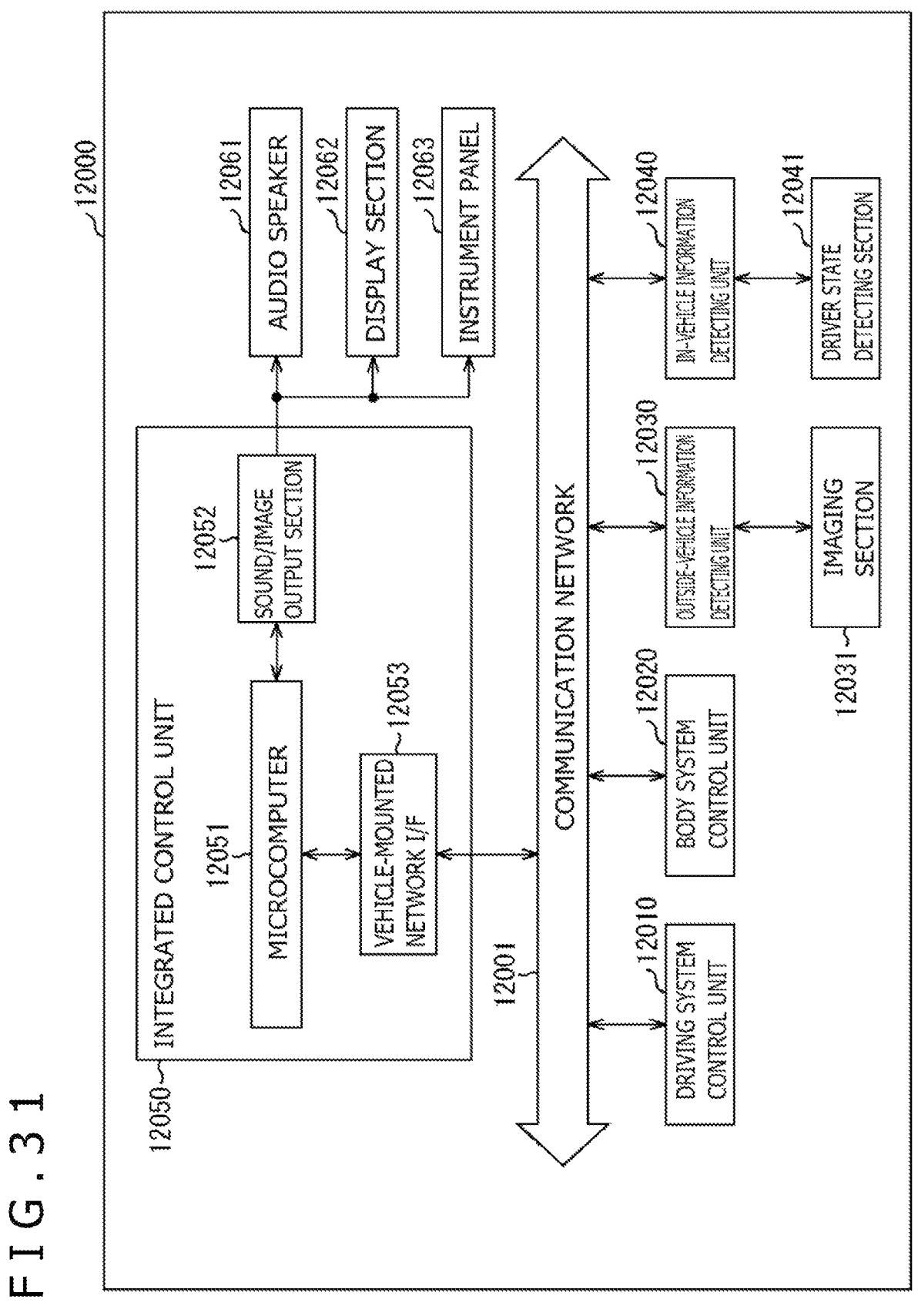
FIG. 31 is a block diagram depicting an example of schematic configuration of a vehicle control system.

FIG. 31 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 31, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle according to various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body according to various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism. The braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, according to the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 31, an audio speaker 12061, a display section 12062, and an instrument panel 12063 are illustrated as the output device. The display section 12062 may, for example, include at least one of an on-board display and a head-up display.

Figure 32:
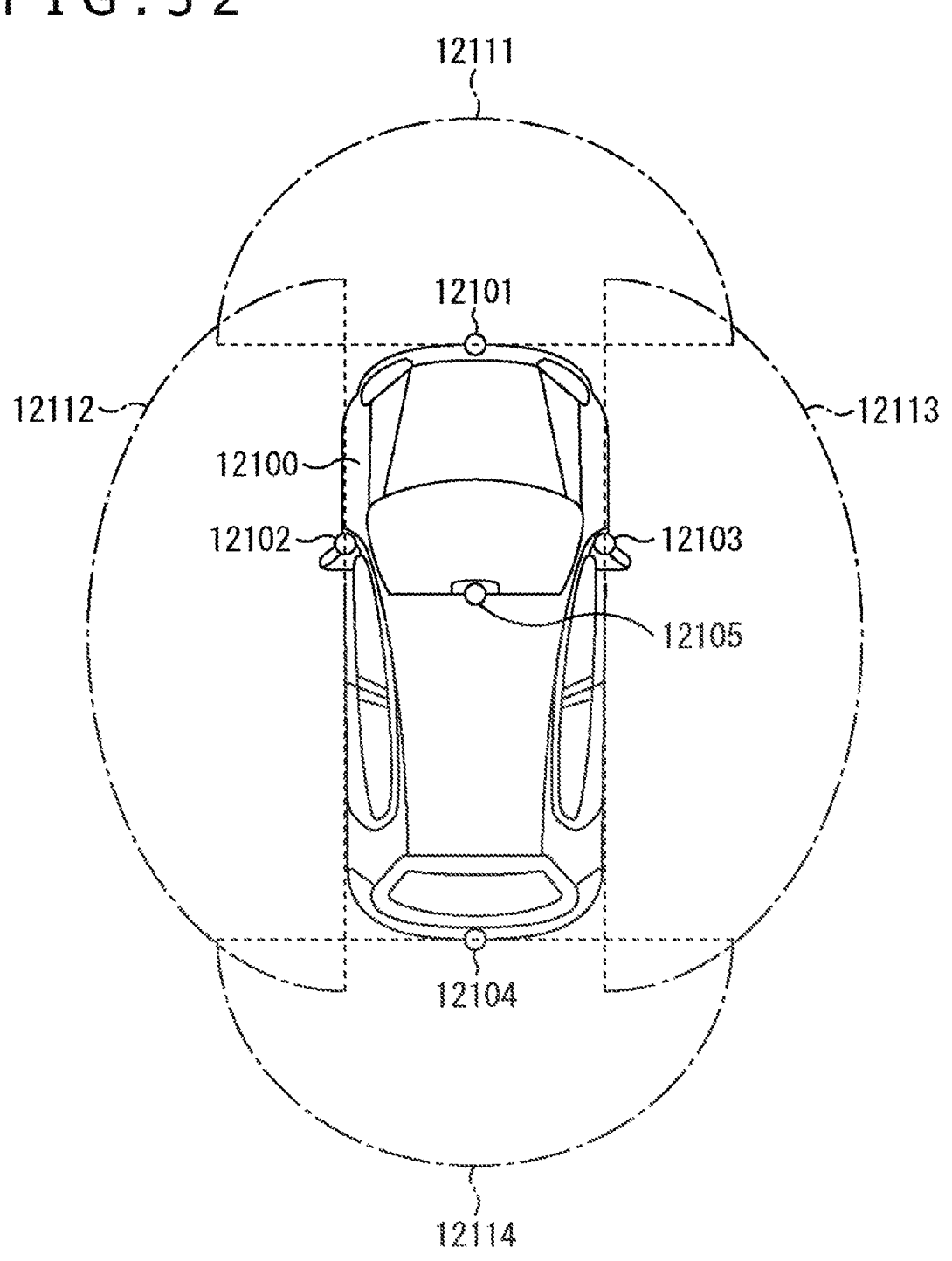
FIG. 32 is a diagram of assistance in explaining an example of installation positions of an outside-vehicle information detecting section and an imaging section.

FIG. 32 is a diagram depicting an example of the installation position of the imaging section 12031.

In FIG. 32, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Incidentally, FIG. 32 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera including a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been explained above. The technology of the present disclosure may be applied advantageously, for example, to the imaging section 12031 among the above-described components. Specifically, the distance measuring apparatus 90 including the sensing device discussed above (i.e., above-described circuits 100 through 109), along with the light source 91, can be mounted in the imaging section 12031. Applying the technology of this disclosure to the imaging section 12031 makes it possible to obtain accurate distance information in an environment with a wide dynamic range of brightness and enhance the functionality and safety of the vehicle 12100.

The present disclosure can be implemented preferably in the following configurations:

(1)
A sensing device including:
a photodetector;
a load element connected interposingly between the photodetector and a first reference potential;
a first transistor of a first conductivity type configured to be turned on according to a voltage of a first signal line interposed between the photodetector and the load element;
a second transistor of the first conductivity type configured to turn on a state between the first reference potential and the first transistor according to a current of the first transistor or a voltage of a second signal line;
a third transistor of a second conductivity type configured to turn on a state between the first transistor and a second reference potential according to the voltage of the second signal line; and
a first inverter connected interposingly between a third signal line and a fourth signal line, the third signal line being interposed between the first transistor and the third transistor.

(2)
The sensing device as stated in paragraph (1) above, further including:
a pulse generator configured to output a pulse onto the second signal line according to a voltage of the fourth signal line.

(3)
The sensing device as stated in paragraph (2) above, is which
the pulse generator is configured such that, when a voltage level on the fourth signal line is changed, the pulse generator outputs a pulse onto the second signal line, following a time delay.

(4)
The sensing device as stated in any one of paragraphs (1) through (3) above, further including:
a first resistor connected interposingly between the load element and the photodetector; and
a fourth transistor of the first conductivity type connected in series to the first resistor.

(5)
The sensing device as stated in any one of paragraphs (1) through (4) above, further including:
a second inverter connected to the second signal line, in which
the load element is a fifth transistor of the first conductivity type, and
the fifth transistor is configured to be turned on according to an output voltage from the second inverter.

(6)
The sensing device as stated in any one of paragraphs (1) through (4) above, further including:
a sixth transistor of the second conductivity type configured to turn on a state between the second reference potential and the second signal line according to the voltage of the second signal line, in which
the load element is a fifth transistor of the first conductivity type configured to be turned on according to the voltage of the second signal line.

(7)
The sensing device as stated in paragraph (2) or (3) above, in which
the pulse generator includes a first delay device, a second delay device connected in series to the first delay device, an AND circuit connected to a downstream side of the second delay device, and a third inverter connected interposingly between the first delay device and the AND circuit, the first delay device being connected to the fourth signal line, the AND circuit having a downstream side connected to the second signal line.

(8)
The sensing device as stated in paragraph (2) or (3) above, in which
the pulse generator includes an inverter chain.

(9)
The sensing device as stated in paragraph (2) or (3) above, in which
the pulse generator includes a flip-flop and a fourth inverter connected to a Q terminal of the flip-flop, the flip-flop having a D terminal connected to the fourth signal line, the fourth inverter having an output side connected to the second signal line.

(10)
The sensing device as stated in paragraph (2) or (3) above, in which
the pulse generator includes a source-grounded two-stage amplification circuit, a first current source connected to a first stage of the two-stage amplification circuit, a second current source connected to a second stage of the two-stage amplification circuit, a capacitor connected interposingly between the first stage and the second stage of the two-stage amplification circuit, and a fifth inverter connected to the first stage of the two-stage amplification circuit, the two-stage amplification circuit having an input terminal connected to the fourth signal line, the fifth inverter having an output terminal connected to the second signal line.

(11)

The sensing device as stated in any one of paragraphs (1) through (10) above, in which the photodetector is mounted on a first substrate connected electrically via Cu—Cu connections to a second substrate on which other elements are mounted.

(12)

The sensing device as stated in any one of paragraphs (1) through (10) above, in which the photodetector includes an avalanche photodiode.

(13)

A distance measuring apparatus having a plurality of sensing devices as stated in any one of paragraphs (1) through (12) above, the distance measuring apparatus including:

a light source;

a logic circuit configured to output a result of an OR operation on output voltages from the plurality of sensing devices; and a measuring circuit configured to measure a distance to an object on the basis of a timing at which light is emitted from the light source and of a signal output from the logic circuit.

(14)

The distance measuring apparatus as stated in paragraph (13) above, further including:

a control circuit connected to the second signal lines of the plurality of sensing devices, in which the control circuit is configured to output a pulse onto the second signal lines on the basis of a signal input to the measuring circuit from the fourth signal line of at least any one of the sensing devices.

(15)

A sensing device including:

a photodetector;

a load element connected interposingly between the photodetector and a first reference potential;

a seventh transistor of a second conductivity type configured to turn on a state between the photodetector and a sixth signal line according to a voltage of a fifth signal line;

an eighth transistor of a first conductivity type configured to turn on a state between the first reference potential and the seventh transistor according to the voltage of the fifth signal line;

a ninth transistor of the first conductivity type configured to turn on a state between the first reference potential and a seventh signal line according to a voltage of the sixth signal line;

a tenth transistor of the second conductivity type configured to turn on a state between the seventh signal line and a second reference potential according to a voltage of an eighth signal line; and a sixth inverter connected interposingly between the seventh signal line and a ninth signal line, in which the fifth signal line is connected to the ninth signal line.

(16)

The sensing device as stated in paragraph (15) above, further including:

a pulse generator configured to output a poise onto the eighth signal line according to a voltage of the ninth signal line.

(17)

The sensing device as stated in paragraph (15) or (16) above, further including:

a first resistor connected interposingly between the load element and the photodetector; and a fourth transistor of the first conductivity type connected is series to the first resistor.

(16)

The sensing device as stated in any one of paragraphs (15) through (17) above, further including:

an eleventh transistor configured to turn on a state between the first reference potential and the ninth transistor according to a voltage applied to a first control electrode.

(19)

The sensing device as stated in any one of paragraphs (15) through (18) above, further including:

a twelfth transistor configured to turn on a state between the seventh signal line and the tenth transistor according to a voltage applied to a second control electrode.

(20)

A sensing device including:

a photodetector;

a load element connected interposingly between the photodetector and a first reference potential;

a seventh transistor of a second conductivity type configured to turn on a state between the photodetector and a sixth signal line according to a voltage of a fifth signal line;

an eighth transistor of a first conductivity type configured to turn on a state between the first reference potential and the seventh transistor according to the voltage of the fifth signal line;

a ninth transistor of the first conductivity type configured to turn on a state between the first reference potential and a seventh signal line according to a voltage of the sixth signal line;

a tenth transistor of the second conductivity type configured to turn on a state between the seventh signal line and a second reference potential according to a voltage of an eighth signal line;

a sixth inverter connected to the seventh signal line;

a seventh inverter connected interposingly between the sixth inverter and a ninth signal line;

a third delay device connected to the ninth signal line;

a NOR circuit configured to output onto the eighth signal line a result of a NOR operation on an output voltage from the third delay device and on a voltage of a tenth signal line; and a NAND circuit configured to output onto the fifth signal line a result of a NAND operation on a voltage of the ninth signal line and on a voltage of the eighth signal line.

The embodiments of the present disclosure are not limited to those discussed above and include diverse variations that may be conceived by persons skilled in the art. Also, the advantageous effects of this disclosure are not limited to those stated above. That is, what was disclosed above may be variably supplemented, modified, or partially deleted within the technical idea and scope of the present disclosure as defined by the appended claims and their equivalents.

REFERENCE SIGNS LIST

C1: Capacitor
D1, D2, D3: Delay device
F1, F2: Flip-flop
NP: NAND circuit
NS: NOR circuit
P1, P2, P3: AND circuit
PD: Photodiode
R1: Resistor 1, 1A, 1B: Sensing device
2, 2A: Switching section
3, 3A: initializing section
4, 4A: Amplifying section
5, 5A: Detecting section
6: Quenching section
7: Measuring circuit
8, 8A, 8B, 8C, 8D, 8E, 8F: Pulse generator
9, 9A, 9B: Detecting section
10, 11, 12, 13, 14, 15, 16, 17, 18, 19, 21, 23, 24, 2540, 41, 42, 43: Transistor
30, 31, 32, 33, 34, 35, 36, 37: inverter
51, 52: Substrate
53: Cu—Cu connection
54, 520: Circuit block
55: Buffer
56: Trigger circuit
57: Multiple flip-flops
58: TDC
61, 62, 63, 64, 65, 66, 67, 68, 69, 70, 71: Graph
80: Object
90: Distance measuring apparatus
91: Light source
TR1, TR2, 50, 100, 101, 102, 103, 104, 105, 106, 107, 108, 109, 200: Circuit
150: Control circuit
300: Inverter chain
510: Pixel

The invention claimed is:

1. A sensing device comprising:
a photodetector;
a load element electrically connected between the photodetector and a first reference potential;
a first transistor of a first conductivity type, the first transistor including a gate electrically connected to a first signal line at a first node between the photodetector and the load element;
a second transistor of the first conductivity type, the second transistor including a gate, a first terminal and a second terminal, the gate of the second transistor being electrically connected to a second signal line, the first terminal being electrically connected to the first reference potential;
a third transistor of a second conductivity type, the third transistor including a gate, a first terminal and a second terminal, the gate of the third transistor being electrically connected to the second signal line, the first terminal of the third transistor being electrically connected to the second terminal of the second transistor, the second terminal of the third transistor being electrically connected to a second reference potential; and
a first inverter electrically connected between a third signal line and a fourth signal line, the third signal line being at a second node between the first transistor and the third transistor.

2. The sensing device according to claim 1, further comprising:
a pulse generator configured to output a pulse onto the second signal line according to a voltage of the fourth signal line.

3. The sensing device according to claim 2, wherein the pulse generator is configured such that, when a voltage level on the fourth signal line is changed, the pulse generator outputs a pulse onto the second signal line, following a time delay.

4. The sensing device according to claim 1, further comprising:
a first resistor connected interposingly between the load element and the photodetector; and
a fourth transistor of the first conductivity type connected in series to the first resistor.

5. The sensing device according to claim 1, further comprising:
a second inverter connected to the second signal line, wherein
the load element is a fifth transistor of the first conductivity type, and
the fifth transistor is configured to be turned on according to an output voltage from the second inverter.

6. The sensing device according to claim 1, further comprising:
a sixth transistor of the second conductivity type configured to turn on a state between the second reference potential and the second signal line according to a voltage of the second signal line, wherein
the load element is a fifth transistor of the first conductivity type configured to be turned on according to the voltage of the second signal line.

7. The sensing device according to claim 2, wherein
the pulse generator includes a first delay device, a second delay device connected in series to the first delay device, an AND circuit connected to a downstream side of the second delay device, and a third inverter connected interposingly between the first delay device and the AND circuit, the first delay device being connected to the fourth signal line, the AND circuit having a downstream side connected to the second signal line.

8. The sensing device according to claim 2, wherein the pulse generator includes an inverter chain.

9. The sensing device according to claim 2, wherein the pulse generator includes a flip-flop and a fourth inverter connected to a Q terminal of the flip-flop, the flip-flop having a D terminal connected to the fourth signal line, the fourth inverter having an output side connected to the second signal line.

10. The sensing device according to claim 2, wherein
the pulse generator includes a source-grounded two-stage amplification circuit, a first current source connected to a first stage of the two-stage amplification circuit, a second current source connected to a second stage of the two-stage amplification circuit, a capacitor connected interposingly between the first stage and the second stage of the two-stage amplification circuit, and a fifth inverter connected to the first stage of the two-stage amplification circuit, the two-stage amplification circuit having an input terminal connected to the fourth signal line, the fifth inverter having an output terminal connected to the second signal line.

11. The sensing device according to claim 1, wherein the photodetector is mounted on a first substrate connected electrically via Cu—Cu connections to a second substrate on which other elements are mounted.

12. The sensing device according to claim 1, wherein the photodetector includes an avalanche photodiode.

13. A distance measuring apparatus having a plurality of sensing devices according to claim 1, the distance measuring apparatus comprising:
a light source;
a logic circuit configured to output a result of an OR operation on output voltages from the plurality of sensing devices; and a measuring circuit configured to measure a distance to an object on a basis of a timing at which light is emitted from the light source and of a signal output from the logic circuit.

14. The distance measuring apparatus according to claim 13, further comprising:

a control circuit connected to the second signal lines of the plurality of sensing devices, wherein the control circuit is configured to output a pulse onto the second signal lines on a basis of a signal input to the measuring circuit from the fourth signal line of at least any one of the sensing devices.

15. A sensing device comprising:

a photodetector;

a load element electrically connected between the photo-detector and a first reference potential;

a first transistor of a first conductivity type, the first transistor including a gate, a first terminal and a second terminal, the gate of the first transistor being electrically connected to a node between the photodetector and the load element, the first terminal of the first transistor being electrically connected to the first reference potential;

a second transistor of a second conductivity type, the second transistor including a gate, a first terminal and a second terminal, the gate of the second transistor being electrically connected to the gate of the first transistor, the first terminal of the second transistor being electrically connected to the second terminal of the first transistor, the second terminal of the second transistor being electrically connected to a node between the load element and the photodetector;

a third transistor of the first conductivity type, the third transistor including a gate, a first terminal and a second terminal, the gate of the third transistor being electrically connected to a second node between the first transistor and the second transistor, the first terminal of the third transistor being electrically connected to the first reference potential; and an inverter including an input electrically connected to the second terminal of the third transistor.

16. The sensing device according to claim 15, further comprising:

a pulse generator electrically connected to an output of the inverter.

17. The sensing device according to claim 15, further comprising:

a first resistor electrically connected between the load element and the photodetector; and a fourth transistor of the first conductivity type connected in series with the first resistor.

18. The sensing device according to claim 15, further comprising:

a fifth transistor electrically connected between the first reference potential and the third transistor and including a gate electrically connected to a first control electrode.

19. The sensing device according to claim 15, further comprising:

a sixth transistor including a gate and a first terminal, the first terminal of the sixth transistor being electrically connected to the input of the inverter, the first terminal of the sixth transistor being electrically connected to a second control electrode.

20. A sensing device comprising:

a photodetector;

a load element electrically connected between the photo-detector and a first reference potential;

a first transistor of a first conductivity type, the first transistor including a gate, a first terminal and a second terminal, the gate of the first transistor being electrically connected to a node between the photodetector and the load element, the first terminal of the first transistor being electrically connected to the first reference potential;

a second transistor of a second conductivity type, the second transistor including a gate, a first terminal and a second terminal, the gate of the second transistor being electrically connected to the gate of the first transistor, the first terminal of the second transistor being electrically connected to the second terminal of the first transistor, the second terminal of the second transistor being electrically connected to a node between the load element and the photodetector;

a third transistor of the first conductivity type, the third transistor including a gate, a first terminal and a second terminal, the gate of the third transistor being electrically connected to a second node between the first transistor and the second transistor, the first terminal of the third transistor being electrically connected to the first reference potential;

an inverter including an input electrically connected to the second terminal of the third transistor;

a NAND circuit configured to output a result of a NAND operation on an output of a delay device and an enable signal; and a NOR circuit including inputs electrically connected to the output of the NAND circuit and an output of the inverter and an output electrically connected to the gate of the first transistor and the gate of the second transistor.

* * * * *